US012666972B2

(12) United States Patent
Hoo et al.

(10) Patent No.: US 12,666,972 B2
(45) Date of Patent: Jun. 23, 2026

(54) DIE PACKAGE WITH GUARD STRUCTURE TO REDUCE OR PREVENT MATERIAL SEEPAGE INTO AIR CAVITY, AND RELATED FABRICATION METHODS

(71) Applicants: QUALCOMM Technologies, Inc., San Diego, CA (US); RF360 Singapore Pte. Ltd., Singapore (SG)

(72) Inventors: Yeng Kwan Hoo, Unterhaching (DE); Emre Topal, Munich (DE); Shook Foong Ho, Singapore (SG); Poh Hoong Yong, Johor Bahru (MY); Huan En Ku, Singapore (SG)

(73) Assignees: QUALCOMM TECHNOLOGIES, INC., San Diego, CA (US); RF360 SINGAPORE PTE. LTD., Singapore (SG)

( * ) Notice: Subject to any disclaimer, the term of this patent is extended or adjusted under 35 U.S.C. 154(b) by 333 days.

(21) Appl. No.: 18/467,798

(22) Filed: Sep. 15, 2023

(65) Prior Publication Data

US 2025/0096164 A1 Mar. 20, 2025

(51) Int. Cl.
H10W 44/20 (2026.01)
H10W 74/10 (2026.01)
(Continued)

(52) U.S. Cl.
CPC ......... H10W 44/20 (2026.01); H10W 74/121 (2026.01); H10W 90/00 (2026.01);
(Continued)

(58) Field of Classification Search
CPC .................. H01L 23/66; H01L 23/3135; H01L 23/49816; H01L 24/13; H01L 24/16;
(Continued)

(56) References Cited

U.S. PATENT DOCUMENTS 5,969,461 A 10/1999 Anderson et al.
10,888,001 B2 1/2021 Lin et al.
(Continued)

FOREIGN PATENT DOCUMENTS

CN 115424989 A 12/2022
CN 115206902 B 1/2023
CN 116110877 A 5/2023

OTHER PUBLICATIONS

Cn 101978483A—In-situ cavity integrated circuit package, 26 pages. (Year: 2025).*
(Continued)

*Primary Examiner* — Tuyen K Vo
(74) *Attorney, Agent, or Firm* — Withrow & Terranova, PLLC

(57) ABSTRACT

Bare die package with guard to reduce or prevent material seepage into an air cavity, and related fabrication methods. In exemplary aspects, to avoid or reduce material (e.g., an encapsulation material such as a mold material and/or a coating material) from entering or seeping into the air cavity in the active filter region of a filter, the die package includes a guard structure. The guard structure is a structure on or adjacent to the die operable to be used in a filter that redirects or reduces material from entering the gap between the die and the substrate. The guard structure reduces or prevents the material entering the air cavity of the die so as to avoid such material affecting the acoustic performance of the air cavity of the filter.

14 Claims, 20 Drawing Sheets

(51) Int. Cl.
    H10W 90/00        (2026.01)
    *H10W 72/00*        (2026.01)
    *H10W 72/20*        (2026.01)

(52) U.S. Cl.
    CPC .... H10W 90/701 (2026.01); *H10W 72/07252* (2026.01); *H10W 72/221* (2026.01); *H10W 72/242* (2026.01); *H10W 90/724* (2026.01)

(58) Field of Classification Search
    CPC ................. H01L 25/0655; H01L 2224/13023; H01L 2224/16013; H01L 2224/16235; H03H 9/10
    See application file for complete search history.

(56) References Cited

U.S. PATENT DOCUMENTS

| | | | | |
|---|---|---|---|---|
| 12,040,285 | B2 * | 7/2024 | Lai | ........................ H01L 21/563 |
| 2003/0000067 | A1 | 1/2003 | Hori | |
| 2004/0147106 | A1 * | 7/2004 | Okada | ............... H01L 21/76835 |
| | | | | 438/619 |
| 2005/0127484 | A1 * | 6/2005 | Wills | .................... H01L 23/562 |
| | | | | 257/E23.101 |
| 2006/0030128 | A1 * | 2/2006 | Bu | .................... H01L 21/76807 |
| | | | | 438/462 |
| 2008/0197478 | A1 * | 8/2008 | Yang | ................... H01L 23/3121 |
| | | | | 438/119 |
| 2011/0068461 | A1 * | 3/2011 | England | .................. H01L 24/24 |
| | | | | 257/700 |
| 2015/0097277 | A1 * | 4/2015 | Chen | ................. H01L 23/49816 |
| | | | | 257/668 |
| 2021/0313957 | A1 | 10/2021 | Ku et al. | |
| 2022/0336361 | A1 | 10/2022 | Yu et al. | |
| 2023/0060716 | A1 | 3/2023 | Wu et al. | |

OTHER PUBLICATIONS

International Search Report and Written Opinion for International Patent Application No. PCT/US2024/044620, mailed Jan. 9, 2025, 15 pages.

\* cited by examiner

FILTER DIE
212(1)

202(1)

232(3)

232(2)

232(1)

236(1)

234

UBM
238

226

228

232(4)

208(1)

Y

X

Z

202(1),
208(1)

226

236(1)

236(1)

238

232(1)

224

212(1)

232(2)

Z

X

Y

FILTER DIE
212(2)

240

202(2)

232(3)

236(2)

240

228

240

UBM
238

234

232(1)

Y

208(2)

X

Z

202(2),
208(2)

236(2)

226

236(2)

238

224

232(1)

232(2)

212(2)

Z

X

Y

500

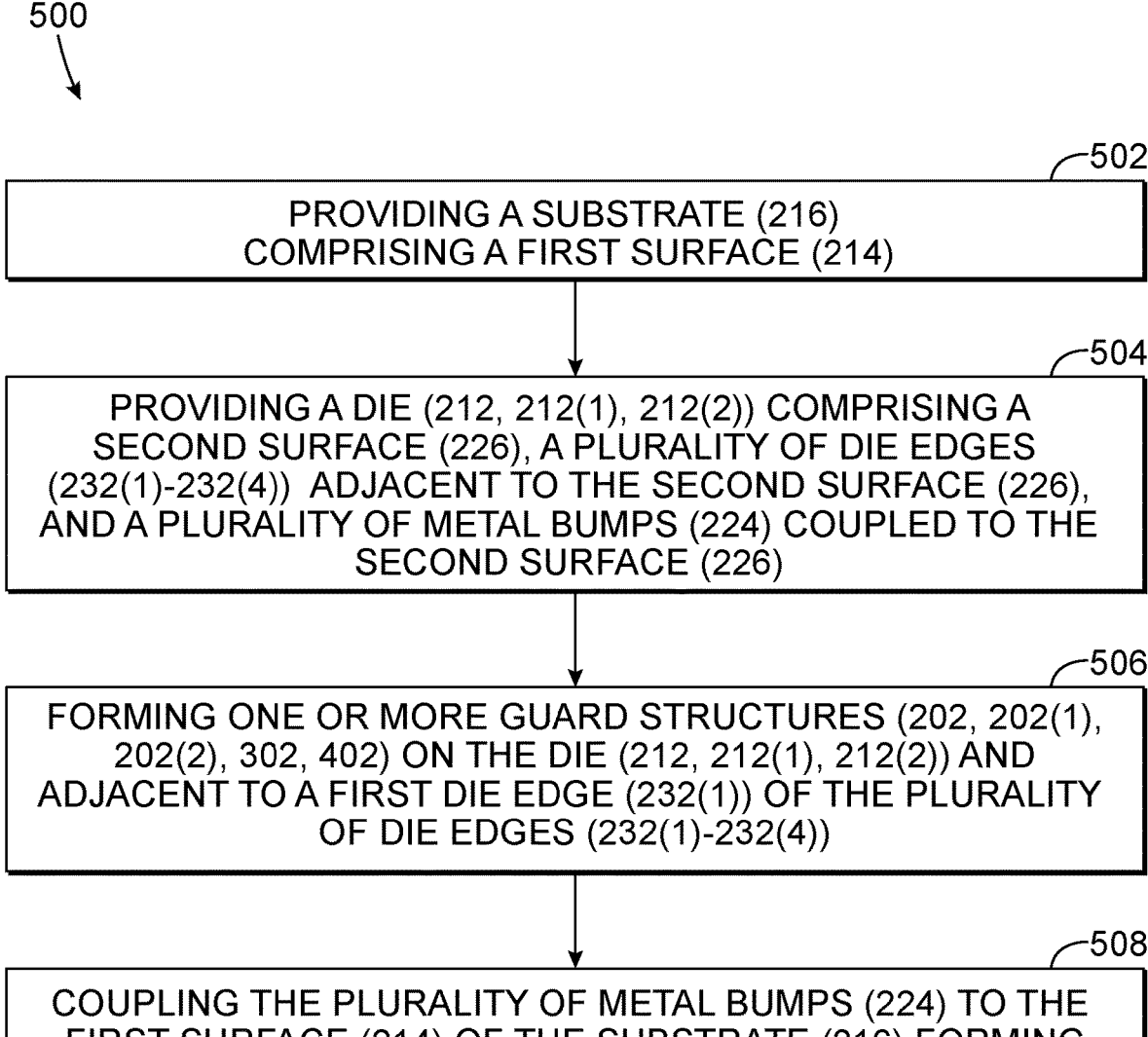

502
PROVIDING A SUBSTRATE (216)
COMPRISING A FIRST SURFACE (214)

504
PROVIDING A DIE (212, 212(1), 212(2)) COMPRISING A
SECOND SURFACE (226), A PLURALITY OF DIE EDGES
(232(1)-232(4)) ADJACENT TO THE SECOND SURFACE (226),
AND A PLURALITY OF METAL BUMPS (224) COUPLED TO THE
SECOND SURFACE (226)

506
FORMING ONE OR MORE GUARD STRUCTURES (202, 202(1),
202(2), 302, 402) ON THE DIE (212, 212(1), 212(2)) AND
ADJACENT TO A FIRST DIE EDGE (232(1)) OF THE PLURALITY
OF DIE EDGES (232(1)-232(4))

508
COUPLING THE PLURALITY OF METAL BUMPS (224) TO THE
FIRST SURFACE (214) OF THE SUBSTRATE (216) FORMING
AN AIR CAVITY (204) IN A GAP (210) BETWEEN THE FIRST
SURFACE (214) AND THE DIE (212, 212(1), 212(2)) AND
DISPOSING THE ONE OR MORE GUARD STRUCTURES
(202, 202(1), 202(2), 302, 402) ADJACENT TO THE GAP (210)

FILTER 206

232(1)

236

208

236

202

226

212

228

704

900C

904

X

Z

Y

806

FROM FIG. 9B

REMOVE PHOTORESISTANT FILM LAYER (706) FROM DIELECTRIC MATERIAL LAYER (904)

800

FILTER 206

FROM FIG. 10A

REMOVE PORTIONS OF METAL LAYER (1104) TO FORM METAL CHANNEL STRUCTURES (236) WITH CHANNEL (208) AS GUARD STRUCTURE (202)

FROM FIG. 12A

REMOVE PASSIVATION LAYER (1306) IN OPENINGS (708) IN A PATTERNED PHOTO RESIST PASSIVATION FILM LAYER (706) TO FORM PASSIVATION CHANNEL STRUCTURES (236) FOR GUARD STRUCTURE (202)

1206

REMOVE PHOTO RESIST FILM LAYER (706)

1208

1200

DIE PACKAGE WITH GUARD STRUCTURE TO REDUCE OR PREVENT MATERIAL SEEPAGE INTO AIR CAVITY, AND RELATED FABRICATION METHODS

BACKGROUND

I. Field of the Disclosure

The field of the disclosure relates to integrated circuit (IC) packages that incorporate a bare die(s) that may be a bare die acoustic filter(s).

II. Background

Mobile wireless device manufacturers pack ever-increasing capabilities into hand-held sized packages. Increasing capability means that more electronic components must fit into the package. This trend drives a size reduction of electronic components used for radio-frequency (RF) signal processing. A challenge to miniaturizing electronic components is finding a way to provide the same function in a physically smaller electronic device. Another challenge to miniaturizing electronic components is created by a physically smaller device dissipating the same or similar amount of power, leading to the same or similar heat generation. Heat generated within a physically smaller device leads to higher operating temperatures in a smaller package, which increases the potential to affect device performance and its life span. Thus, there is a desire to find ways for more effectively dissipating heat when reducing the device size.

One device that has been employed in RF signal processing circuits (e.g., RF front end (RFFE) circuits) provided in smaller electronic devices for signal filtering is an acoustic wave (AW) filter, such as a surface AW (SAW) filter, or bulk AW (BAW) filter. The AW filter removes or reduces the energy in one or more bands of frequencies from an input analog signal. An AW filter filters frequencies by transforming electromagnetic wave propagation into mechanical wave propagation on the surface of a substrate material. AW filters can be implemented as a die filter and included in a package, such as an IC package, a system-in-a-package (SiP), a bare die module package (BDMP), or other IC packages or modules. In an IC package, a filter circuit can be incorporated as a die filter that is coupled to a package substrate like an integrated circuit (IC) die. The die filter is encapsulated in the SiP. In a BDMP or chip-scale package (CSP), a die filter is provided as a bare die filter that is coupled to a package substrate and is also encapsulated. The bare die filter has an air cavity in an active filter region of a die operable to be used in a filter ("filter die") that is preserved as an acoustic cavity between the die filter and the package substrate. The volume of the air cavity is designed to act as a resonator to filter and pass RF signals that were converted from an electrical signal to mechanical energy. There is a gap between the filter die and the substrate when the filter die is coupled to the substrate that defines the height of the air cavity. During the encapsulation and/or coating process for the filter die, the encapsulation or coating material may seep (i.e., slowly flow) in through the gap and into the air cavity, which includes metal interconnects, metal pads, and an active filter region of the filter die. It is important to prevent or reduce seepage of the encapsulation or coating material into the air cavity so as to not alter the acoustic filtering properties of the air cavity in an unintended manner to avoid yield loss and/or a reliability failure.

SUMMARY OF THE DISCLOSURE

Aspects disclosed herein include a die package with a guard structure to reduce or prevent material seepage into an air cavity. Related fabrication methods are also disclosed. The die package may be a bare die module package (BDMP) or chip scale package (CSP) as examples. The die package is an integrated circuit (IC) package that includes at least one bare semiconductor die ("die"). A bare die is a die in a die package that has an area free of encapsulation between a surface of the die and a coupled surface (e.g., a surface of a package substrate) adjacent to the surface of die. The area that is free of encapsulation between the die and the coupled surface provides an air cavity between the die and the coupled surface. The die package includes a filter that is a cavity filter that has an area free of encapsulation between an active side of a die operable to be used as a filter ("filter die") and a coupled surface to maintain an air cavity that acts as a cavity resonator to filter and pass radio-frequency (RF) signals at particular frequencies. The filter die can include a filter circuit(s) and/or device, such as an acoustic wave (AW) filter, which could be a surface AW (SAW) filter, or bulk AW (BAW) filter. Thus, the volume of the air cavity is specifically designed to provide the desired acoustic filtering properties for the filter. In exemplary aspects, to avoid or reduce a material (e.g., an encapsulation material such as a mold material and/or a coating material) from entering or seeping into the air cavity of the filter (e.g., during fabrication), the die packages disclosed herein include a guard structure. The guard structure is a structure on or adjacent to the filter die that redirects or reduces material from entering the gap between the filter die and the substrate. The guard structure reduces or prevents the material entering the air cavity of the filter die so as to avoid such material affecting the acoustic performance of the air cavity of the filter. The guard structure may redirect or reduce material from entering into the air cavity in an active filter region of the filter, that is the area of the die that includes a circuit and/or filtering material (i.e., a piezoelectric material) involved in filtering signals.

In one example, the guard structure is adjacent to and/or at one or more die edges of the filter die, outside the air cavity outside the active filter region of the filter die. The guard structure redirects or reduces material from entering the gap adjacent to die edge(s) of the filter die, and thus redirects or reduces material from entering the air cavity in the active filter region of the filter die. Providing the guard structure can also avoid having to enlarge the die size to provide enough area in the gap between the die edges and the active filter region of the filter die to receive material to reduce or avoid such material seeping or entering into the air cavity in the active filter region of the filter die.

In one exemplary aspect, the guard structure in the die package includes one or more channels that are at least partially in the gap in a filter between the filter die and the substrate in the die package. The one or more channels can be formed to be disposed in the gap between the filter die and the substrate, and may be at and/or adjacent to one or more die edges of the filter die. The channel(s) provides an additional volume and flow path to redirect or reduce excess material (e.g., an encapsulation material such as a mold material and/or a coating material) adjacent to the die edge(s) from seeping into the air cavity in the active filter region of the filter die. The channel(s) being disposed in the gap also reduces the height of the gap adjacent to the edge(s) of the filter die, thereby providing less area for material (e.g., an encapsulation material such as a mold material and/or a coating material) to enter into the air cavity in the active filter region of the filter die. Each channel may be formed as an area between two adjacent channel structures extending parallel to each other adjacent to the die edge(s) of the filter die. The channel structures may be a portion of a layer (e.g., a photoresist film layer, a dielectric layer, a metal layer, a passivation layer) that was formed during fabrication or assembly of the die package and processed to form the channel structures.

In another example, the guard structure in the die package includes a raised structure that is coupled to the filter die and extends into the gap between the filter die and the substrate. The raised structure is formed in the gap at and/or adjacent to one or more die edges of the filter die outside the active filter region of the filter die. The raised structure may extend to the die edge(s) of the filter die. The raised structure being disposed in the gap reduces the height of the gap adjacent to the edge(s) of the filter die, thereby providing less area for an encapsulation material (e.g., a mold material and/or a coating material) to enter into the air cavity in the active filter region of the filter die. The raised structure may be a portion of a layer (e.g., a photoresist film layer, a dielectric layer, a metal layer, a passivation layer) that was formed during fabrication or assembly of the die package and processed to form the raised structure.

In another exemplary aspect, the guard structure in the die package is provided as a die recess(es) formed in the filter die adjacent to the gap between the filter die and the substrate. The die recess(es) is formed adjacent to and/or at one or more die edges of the filter die and outside of the air cavity in the active filter region of the filter die. The die recess(es) in the filter die provides an additional volume of space as a type of reservoir that can receive and retain encapsulation material (e.g., a mold material and/or a coating material) or other material. This can reduce or prevent such material from entering or seeping into the air cavity in the active filter region of the filter. The additional volume of space provided by the recess in the filter die in essence provides an area of reduced resistance over the resistance of the gap to cause additional material to enter and remain outside of the air cavity in the active filter region of the filter die. In another example, the die recess(es) in the filter die may also be formed adjacent to and/or at all the die edges of the filter die to surround the entire active filter region of the filter die. As another example, the die recess(es) may be formed by performing a reserve die cut to the filter die during fabrication and/or assembly of the filter die or die package.

Note that in examples disclosed herein, the die package can be provided as a bare die module package (BDMP) or chip scale package (CSP) that includes one or more filters. The die package can also be provided as an IC package in which in addition to one or more filters, other IC dies (e.g., a radio-frequency IC (RFIC) die, a system-on-a-chip (SiP), a power management IC (PMIC) die, a memory die) can be included and also coupled to the substrate of the IC package.

In this regard, in one exemplary aspect, a die package is provided. The die package comprises a substrate comprising a first surface. The die package also comprises a filter comprising a die operable to be used in a filter and comprising a second surface, and a plurality of die edges adjacent to the second surface. The filter also comprises a plurality of metal bumps coupled to the second surface and coupled to the first surface of the substrate forming a gap between the first surface and the die. The filter also comprises an air cavity in the gap between the first surface and the die. The die package also comprises one or more guard structures each adjacent to the gap and each adjacent to a first die edge of the plurality of die edges.

In another exemplary aspect, a method of fabricating a die package is provided. The method comprises providing a substrate comprising a first surface. The method also comprises providing a die operable to be used in a filter and comprising a second surface, a plurality of die edges adjacent to the second surface, and a plurality of metal bumps coupled to the second surface. The method also comprises forming one or more guard structures on the die and adjacent to a first die edge of the plurality of die edges. The method also comprises coupling the plurality of metal bumps to the first surface of the substrate forming an air cavity in a gap between the first surface and the die and disposing the one or more guard structures adjacent to the gap.

BRIEF DESCRIPTION OF THE FIGURES

FIGS. 2C-1 and 2C-2 are respective partial top and side views of the filter die that can be provided in the die package in FIG. 2A, and illustrate exemplary discontinuous channels formed on the bottom surface of the die, adjacent to die edges of the filter die, such that the discontinuous channels will be disposed in the gap between the filter die and the substrate;

FIG. 5 is a flowchart illustrating an exemplary fabrication process of fabricating a die package that includes a filter that is a bare die filter that includes a die operable to be used in a filter ("filter die") coupled to a substrate with an air cavity formed in a gap between the filter die and the substrate, wherein the die package also includes a guard structure to redirect material (e.g., an encapsulation material such as a mold material and/or a coating material) from entering or seeping into the air cavity of the filter, including, but not limited to, the die packages in FIGS. 2A, 2B-1-2B-2, 2C-1-2C-2, 3, and 4;

DETAILED DESCRIPTION

Figure 1A:
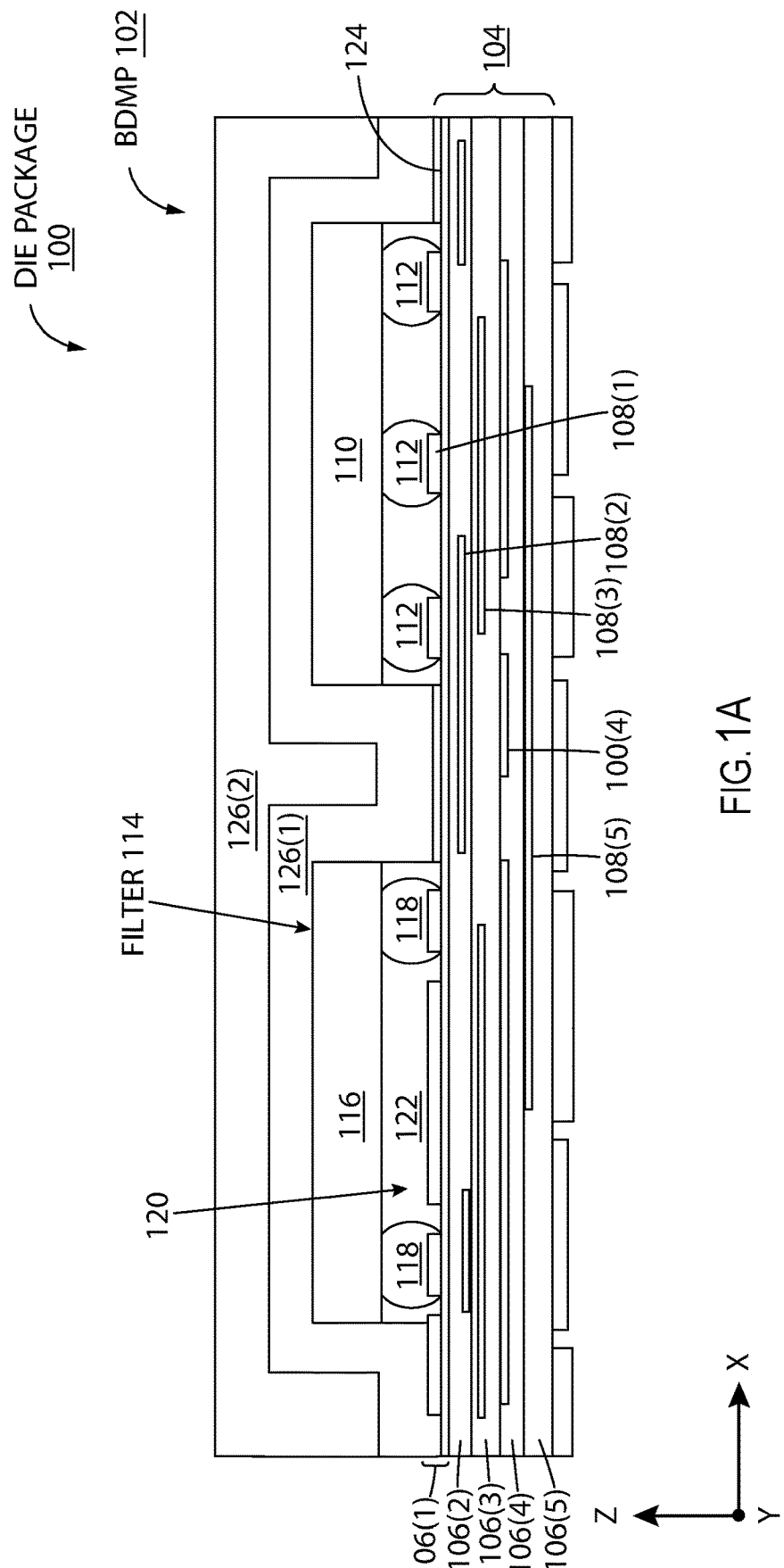
FIG. 1A is a side view of an exemplary die package in the form of a bare die module package (BDMP) that includes filters that are bare die filters that each include a die operable to be used in a filter ("filter die") coupled to a substrate (e.g., a package substrate) with respective air cavities formed between the dies and the substrate.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include a die package with guard to reduce or prevent material seepage into an air cavity. Related fabrication methods are also disclosed. The die package may be a bare die module package (BDMP) or chip scale package (CSP) as examples. The die package is an integrated circuit (IC) package that includes at least one bare semiconductor die ("die"). A bare die is a die in a die package that has an area free of encapsulation between a surface of the die and a coupled surface (e.g., a surface of a package substrate) adjacent to the surface of die. The area that is free of encapsulation between the die and the coupled surface provides an air cavity between the die and the coupled surface. The die package includes a filter that is a cavity filter that has an area free of encapsulation between an active side of a die operable to be used as a filter ("filter die") and a coupled surface to maintain an air cavity that acts a cavity resonator to filter and pass radio-frequency (RF) signals at particular frequencies. The filter die can include a filter circuit(s) and/or device, such as an acoustic wave (AW) filter, which could be a surface AW (SAW) filter, or bulk AW (BAW) filter. Thus, the volume of the air cavity is specifically designed to provide the desired acoustic filtering properties for the filter. In exemplary aspects, to avoid or reduce material (e.g., an encapsulation material such as a mold material and/or a coating material) from entering or seeping into the air cavity of the filter (e.g., during fabrication), the die packages disclosed herein include a guard structure. The guard structure is a structure on or adjacent to the filter die that redirects or reduces material from entering the gap between the filter die and the substrate. The guard structure reduces or prevents the material entering the air cavity of the filter die so as to avoid such material affecting the acoustic performance of the air cavity of the filter. The guard structure may redirect or reduce material from entering into the air cavity in an active filter region of the filter, that is the area of the die that includes a circuit and/or filtering material (i.e., a piezoelectric material) involved in filtering signals.

Before discussing examples of a bare die package that includes a filter that can be a bare die filter and that also includes a guard structure to redirect material (e.g., an encapsulation material such as a mold material and/or a coating material) from entering or seeping into the air cavity of the filter, a bare die package that does not include such guard structure is first discussed below with regard to FIGS. 1A and 1B.

Figure 1B:
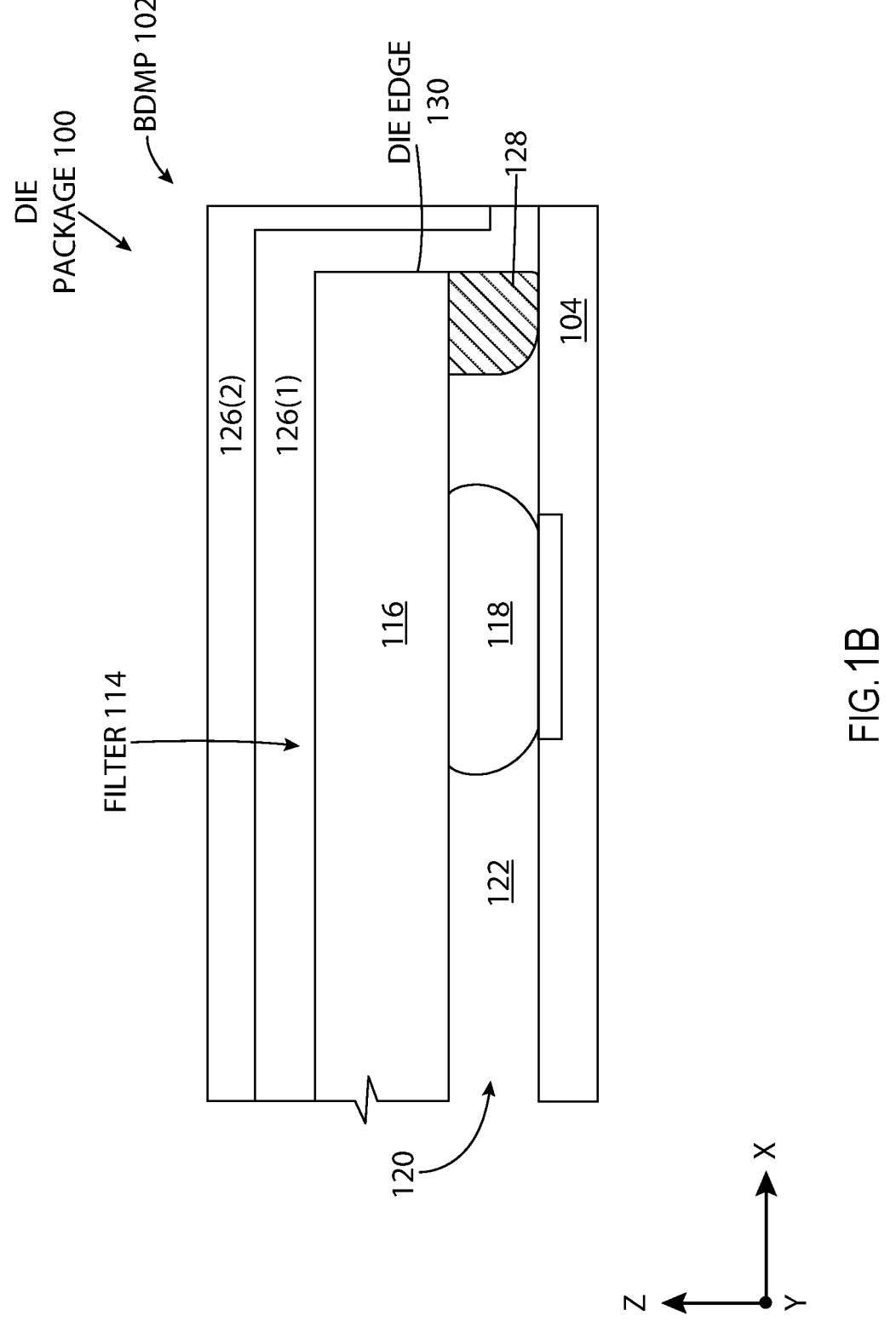
FIG. 1B is a close up side view of a portion of the die package in FIG. 1A.

In this regard, FIGS. 1A and 1B are side views of an exemplary integrated die package 100 in the form of a bare die module package (BDMP) 102. The BDMP 102 in FIGS.

1A and 1B is a die package that includes at least one die that has an area free of encapsulation between a die side and a coupled surface (e.g., a surface of a package substrate). The area that is free of encapsulation between the die and the coupled surface provides an air cavity between the die and the coupled surface. For example, a die package may include a filter that is a bare die filter that is a cavity filter that is free of encapsulation between an active side of a die operable to be used in a filter ("filter die") and a coupled surface to maintain an air cavity that acts a cavity resonator to filter and pass RF signals at particular frequencies.

In this example, as shown in FIG. 1A, the BDMP 102 includes a package substrate 104 that includes one or more metallization layers 106(1)-106(5) in parallel with each other in a first, horizontal direction(s) (X- and/or Y-axis directions). The metallization layers 106(1)-106(5) include respective metal interconnects 108(1)-108(5) (e.g., metal traces, metal lines) to provide external signal routing to a semiconductor die ("die") 110 in this example. The die 110 is electrically coupled to the package substrate 104 through one or more metal bumps 112 (e.g., metal interconnects, solder balls, ball grid array (BGA) interconnects) being coupled to metal interconnects 108(1) in the metallization layer 106(1) adjacent to the die 110. The BDMP 102 also includes a filter 114 that is a bare die filter in this example. The BDMP 102 includes a die 116 that is operable to be used in the filter 114, and is thus referred to herein as "filter die 116." The filter die 116 is mechanically and electrically coupled to the package substrate 104 through metal bumps 118 such that a gap 120 is present between the filter die 116 and the package substrate 104. The gap 120 provides for an air cavity 122 between the filter die 116 and a first surface 124 of the package substrate 104 to provide an acoustic air cavity for the filter 114. As an example, the filter 114 may be coupled to the die 110 through the package substrate 104 such that the filter 114 can filter signals processed by the die 110. For example, the die 110 may be a radio-frequency integrated circuit (RFIC) die that includes RF front-end and/or transceiver circuits.

As also shown in FIG. 1A, the filter die 116 is encapsulated with first and second encapsulation layers 126(1), 126(2) (e.g., overmold layers in this example) to protect and insulate the filter die 116. The first and second encapsulation layers 126(1), 126(2) are formed from a coating material, such as a mold material, that is disposed (i.e., formed) on the filter die 116 during fabrication and/or assembly of the BDMP 102. For example, the first encapsulation layer 126(1) may have originally been disposed also on the filter die 116, and the second encapsulation layer 126(2) disposed on the first encapsulation layer 126(1). The first encapsulation layer 126(1) also encloses the gap 120 between the filter die 116 and the package substrate 104 such that the air cavity 122 is formed. However, as shown in the close-up partial side view of the die package 100 in FIG. 1B, as part of the process of forming the first encapsulation layer 126(1), a portion 128 of the encapsulation material ("encapsulation material portion 128") that is used to form the first encapsulation layer 126(1) may enter into/seep into the gap 120 adjacent to a die edge 130 of the filter die 116. The encapsulation material portion 128 may enter the gap 120 underneath the filter die 116 between the filter die 116 and the package substrate 104. Note that the encapsulation material portion 128 may also enter the gap 120 adjacent to other die edges of the filter die 116 not shown in FIG. 1B. Thus, this encapsulation material portion 128 of the first encapsulation layer 126(1) enters into what would have been part of the air cavity 122 of the filter 114. It is important to prevent or reduce seepage of the encapsulation material or other material into the air cavity 122 so as to not alter the acoustic filtering properties of the air cavity 122 of the filter die 116 in an unintended manner to avoid yield loss and/or reliability failure.

Figure 2A:
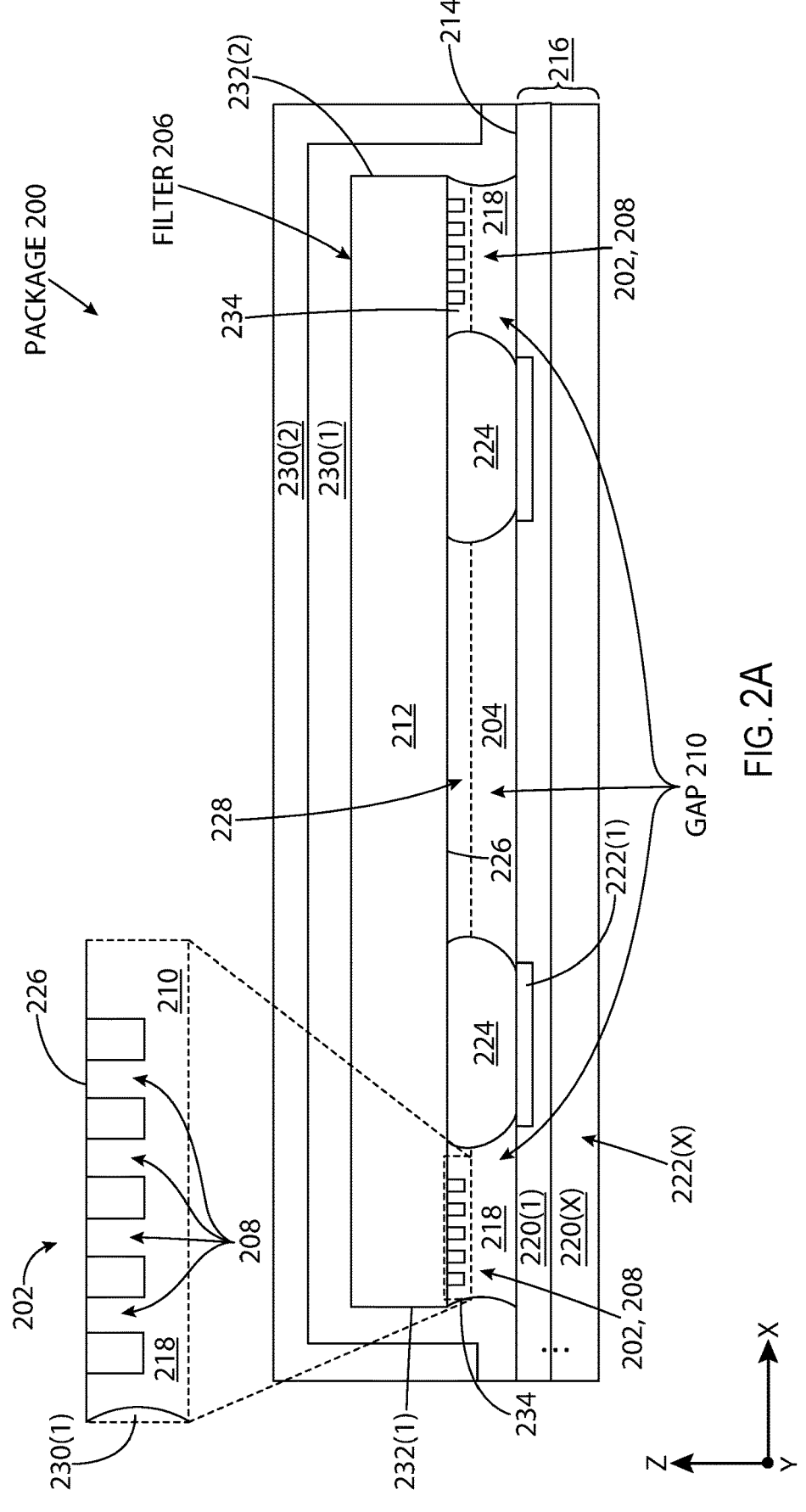
FIG. 2A is a side view of an exemplary die package that includes a filter that is a bare die filter that includes a die operable to be used in a filter ("filter die") coupled to a substrate with an air cavity formed in a gap between the filter die and the substrate, wherein the die package also includes a guard structure in the form of one or more channels in the gap to redirect material (e.g., an encapsulation material such as a mold material and/or a coating material) from entering or seeping into the air cavity of the filter.

To prevent or reduce seepage or bleeding of material (e.g., an encapsulation material such as a mold material and/or a coating material) into an air cavity of a filter so as to not alter the acoustic filtering properties of the air cavity, FIGS. 2A-2C-2 illustrate one example of a die package 200 that is a bare die package that includes a guard structure 202 configured to redirect material (e.g., an encapsulation material such as a mold material and/or a coating material) from entering or seeping into an air cavity 204 of a filter 206 in the die package 200. The filter 206 in this example is a bare die filter. FIG. 2A is a side view of the die package 200. In this example, as discussed in more detail below, the die package 200 includes the guard structure 202 in the form of one or more channels 208 disposed adjacent to a gap 210 between a die 212 that is operable to be used in the filter 206 and a first, top surface 214 of a substrate 216 (e.g., a package substrate). Thus, the die 212 is referred to herein as "filter die 212." The filter die 212 can include a filter circuit(s) and/or device, such as an acoustic wave (AW) filter, which could be a surface AW (SAW) filter, or bulk AW (BAW) filter. In this example, as discussed in more detail below, the channels 208 are disposed in the gap 210. This example of the die package 200 includes multiple channels 208. The channels 208 are configured to redirect an encapsulation material 218 (e.g., a mold material and/or a coating material) or other material from entering or seeping into the air cavity 204 of the filter 206.

The die package 200 in FIG. 2A is an integrated circuit (IC) package that includes a bare semiconductor die ("die") in the form of the filter die 212 in this example. A bare die is a die in an IC package that has an area free of encapsulation between a surface of the die and a coupled surface (e.g., a surface of a package substrate) adjacent to the surface of the die. In this example, the filter 206 includes the filter die 212 that is coupled to the substrate 216, which may be a package substrate. The substrate 216 in this example includes one or more metallization layers 220(1)-220(X) in parallel with each other in a first, horizontal direction(s) (X-axis and/or Y-axis direction(s)). The metallization layers 220(1)-220(X) include respective metal interconnects 222(1)-222(X) (e.g., metal traces, metal lines) to provide external signal routing to the filter die 212 in this example. The filter die 212 is mechanically and electrically coupled to the substrate 216 through one or more metal bumps 224 (e.g., metal interconnects, solder balls, BGA interconnects) being coupled to metal interconnects 222(1) in the upper metallization layer 220(1) adjacent to the filter die 212. The metal bumps 224 are coupled to and between the first, top surface 214 of the substrate 216 and a second, bottom surface 226 of the filter die 212. In this manner, the gap 210 is present between the second, bottom surface 226 of the filter die 212 and the substrate 216 due to the standoff height of the metal bumps 224 in a second, vertical direction (Z-axis direction) orthogonal to the first, horizontal direction(s) (X-axis and/or Y-axis direction(s)). The gap 210 provides for the air cavity 204 in an active filter region 228 of the filter die 212 between the filter die 212 and the first surface 214 of the substrate 216 to provide an acoustic air cavity for the filter 206. The active filter region 228 of the filter die 212 is an area on the second, bottom surface 226 of the filter die 212 that includes a circuit and/or filtering material (i.e., a piezoelectric material) involved in filtering signals as part of the capability of the filter 206. The volume of the air cavity 204 is specifically designed to provide the desired acoustic filtering properties for the filter 206.

As also shown in FIG. 2A, the filter die 212 is encapsulated with first and second encapsulation layers 230(1), 230(2) in this example to protect and insulate the filter die 212. The first and second encapsulation layers 230(1), 230(2) are formed from an encapsulation material, such as a mold material or coating material, that is disposed on the filter die 212 during fabrication and/or assembly of the die package 200. For example, the first encapsulation layer 230(1) may have originally been deposited on the filter die 212, and the second encapsulation layer 230(2) disposed on the first encapsulation layer 230(1). The first encapsulation layer 230(1) also encloses the gap 210 between the filter die 212 and the substrate 216 such that the air cavity 204 is formed. However, as part of the process of forming the first encapsulation layer 230(1), encapsulation material 218 from either the first or second encapsulation layers 230(1), 230(2) enters into or seeps into the gap 210 adjacent to first and/or second die edges 232(1), 232(2) of the filter die 212, wherein the first and second die edges 232(1), 232(2) are adjacent to the second, bottom surface 226 of the filter die 212. Note that the filter die 212 includes at least two (2) additional die edges that are not shown in the side view in FIG. 2A if the filter die 212 is generally rectangular-shaped. However, the encapsulation material 218 can enter or seep into the gap 210 adjacent to the die edges 232(1), 232(2). However, in this example, to prevent or reduce seepage of the encapsulation material 218 into the air cavity 204 of the filter 206 so as to not alter the acoustic filtering properties of the air cavity 204 in an unintended manner to avoid yield loss and/or reliability issues, the channels 208 are provided in the gap 210 adjacent to the first and second die edges 232(1), 232(2) as a guard structure 202, which is now discussed in more detail.

As shown in FIG. 2A, the channels 208 are between respective first and second die edges 232(1), 232(2) of the filter die 212 and respective adjacent metal bumps 224 in the first, horizontal direction(s) (X-axis and/or Y-axis direction(s)) in an inactive region 234 of the filter 206. Note that the channels 208 could just be located adjacent to one die edge, such as the first die edge 232(1). The inactive region 234 of the filter 206 in the gap 210 does not include a circuit and/or filtering material (i.e., a piezoelectric material) on the second, bottom surface 226 of the filter die 212 involved in filtering signals as part of the capability of the filter 206. In this example, the active filter region 228 is in the gap 210, such that the metal bumps 224 are between the active filter region 228 and the inactive region 234 of the filter 206 in the first, horizontal direction(s) (X-axis and/or Y-axis direction(s)). The channels 208 provide an additional volume and flow path to allow material to flow in and along the channels 208 due to capillary flow to redirect or reduce excess encapsulation material 218 (e.g., a mold material and/or a coating material) adjacent to the first and/or second die edges 232(1), 232(2) from seeping into the air cavity 204 in the active filter region 228 of the filter die 212. The channels 208 being disposed in the gap 210 also reduces height of the gap 210 adjacent to the first and second die edges 232(1), 232(2) of the filter die 212, thereby providing less area for the encapsulation material 218 to enter into the air cavity 204 in the active filter region 228 of the filter die 212. In this example, the channels 208 are outside the active filter region 228 of the filter 206. The active filter region 228 is in the gap 210, such that the metal bumps 224 are between the active filter region 228 and the inactive region 234 of the filter 206 in the first, horizontal direction(s) (X-axis and/or Y-axis direction(s)). Thus, the encapsulation material 218 present in the inactive region 234 in the gap 210 and inside the channels 208 does not affect the acoustic properties of the air cavity 204 in the active filter region 228 of the filter 206 in this example.

Figures 1, 2, 2B:
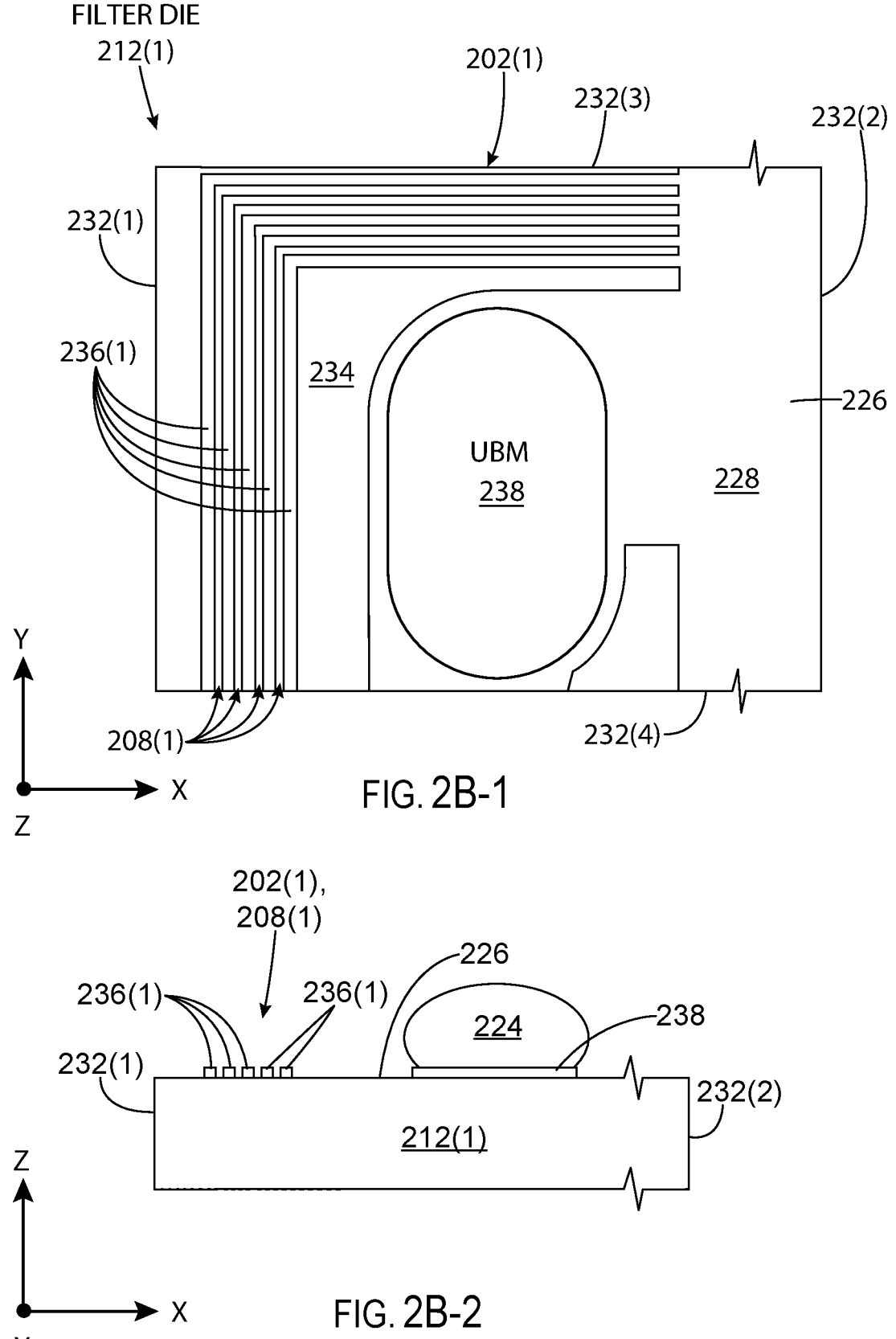
FIGS. 2B-1 and 2B-2 are respective partial top and side views of the filter die that can be provided in the die package in FIG. 2A, and illustrate exemplary continuous channels formed on the bottom surface of the filter die, adjacent to die edges of the filter die, such that the continuous channels will be disposed in the gap between the filter die and the substrate.

FIGS. 2B-1 and 2B-2 are respective partial top and side views of a filter die 212(1) that can be the filter die 212 in the filter 206 in FIG. 2A. Common elements between the filter die 212(1) in FIGS. 2B-1 and 2B-2, and the filter die 212 in FIG. 2A are shown with common element numbers. The filter die 212(1) in FIGS. 2B-1 and 2B-2 has continuous channels 208(1) (that can be the channels 208 in FIG. 2A) as a type of guard structure 202(1) formed on the second, bottom surface 226 of the filter die 212(1) that extend continuously around the inactive region 234 of the filter die 212(1) in a closed pattern. As shown in the partial top view of the filter die 212(1) in FIG. 2B-1, the continuous channels 208(1) extend continuously adjacent to the first die edge 232(1) and a third die edge 232(3) adjacent to and extending in an orthogonal direction (X-axis direction) to the direction (Y-axis direction) of the first die edge 232(1). Note, however, that although not shown in FIG. 2B-1, the continuous channels 208(1) may extend continuously adjacent to each of the first, second, third, and fourth die edges 232(1)-232(4) of the filter die 212(1) to completely surround the active filter region 228 of the filter die 212(1). The continuous channels 208(1) provide an additional volume and flow path to allow material to flow in and along the continuous channels 208(1) due to capillary flow. This redirects or reduces excess encapsulation material 218 (e.g., a mold material and/or a coating material) adjacent to the die edges 232(1)-232(4) from seeping into the air cavity 204 in the active filter region 228 of the filter die 212(1) (see also, FIG. 2A).

As shown in FIGS. 2B-1 and 2B-2, the continuous channels 208(1) are each formed by two adjacent channel structures 236(1) that extend parallel to each other and extend beyond the second, bottom surface 226 of the filter die 212(1) so that the channel structures 236(1) extend into the gap 210 (see FIG. 2A). The channel structures 236(1) may be comprised of a metal material or a dielectric material that can be fabricated or processed as a residual structure from the fabrication of the filter die 212(1) and/or the die package 200. For example, the channel structures 236(1) may be comprised of a photoresist material structure, dielectric material structure, metal structure, or passivation structure formed from a respective deposited photoresist film layer, dielectric layer, metal layer, or passivation layer on the second, bottom surface 226 of the filter die 212(1) as part of patterning openings for under bump metallizations (UBMs) 238. The channel structures 236(1) are formed between respective, adjacent die edges 232(1)-232(4) and metal bumps 224 and their respective UBMs 238 on the filter die 212(1) so that the continuous channels 208(1) are located in the inactive region 234 of the filter die 212(1).

Thus, as shown in FIGS. 2A and 2B-12B-2, the continuous channels 208(1) can redirect material, such as the encapsulation material 218, from entering the gap 210 adjacent to one or more of the die edge(s) 232(1)-232(4) of the filter die 212(1), and thus redirecting and/or reducing material from entering the air cavity 204 in the active filter region 228 of the filter die 212(1). Providing the continuous channels 208(1) as the guard structure 202(1) can also avoid having to enlarge the die size of the filter die 212(1) to provide enough area in the gap 210 between one or more of the die edges 232(1)-232(4) and the active filter region 228 of the filter die 212(1) to receive material to reduce or avoid such material seeping or entering into the air cavity 204 in the active filter region 228 of the filter die 212(1).

Figures 1, 2, 2C:
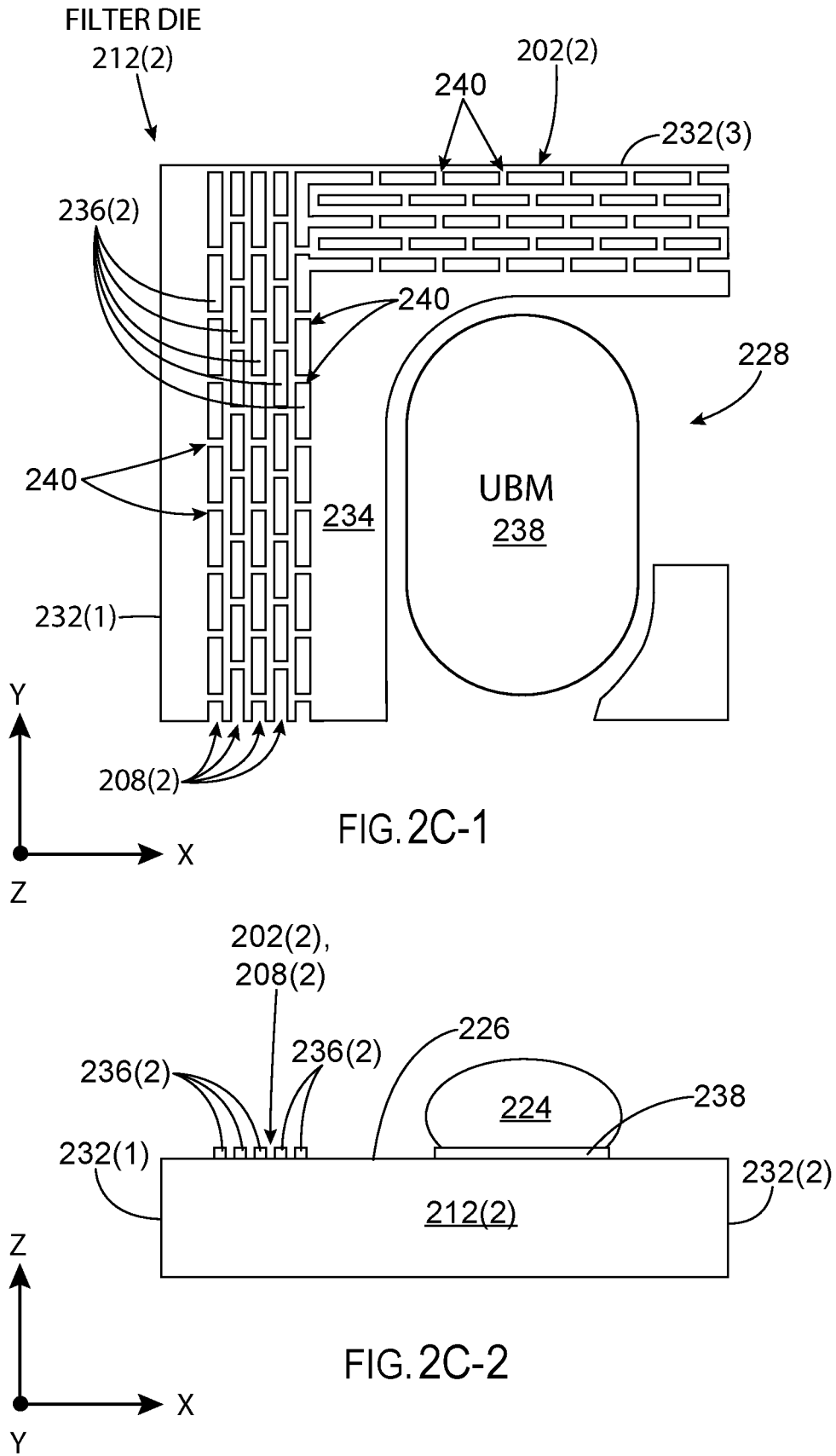

FIGS. 2C-1 and 2C-2 are respective partial top and side views of another, alternative filter die 212(2) that can be the filter die 212 in the filter 206 in FIG. 2A. Common elements between the filter die 212(2) in FIGS. 2C-1 and 2C-2, and the filter die 212 in FIG. 2A are shown with common element numbers. The filter die 212(2) in FIGS. 2C-1 and 2C-2 has discontinuous channels 208(2) (that can be the channels 208 in FIG. 2A) as a type of guard structure 202(2) formed on the second, bottom surface 226 of the filter die 212(2) that extend around the inactive region 234 of the filter die 212(2) in a closed pattern. As shown in FIGS. 2C-1 and 2C-2, the discontinuous channels 208(2) are each formed by two adjacent discontinuous channel structures 236(2) that extend parallel to each other and extend beyond the second, bottom surface 226 of the filter die 212(2) so that the channel structures 236(2) extend into the gap 210 (see FIG. 2A). The discontinuous channel structures 236(2) have openings 240 that allow for additional flow paths into the discontinuous channels 208(2). This may allow for the encapsulation material 218 or other material to more easily enter the discontinuous channels 208(2) to then be retained within the discontinuous channels 208(2) to prevent or reduce such material from entering into or seeping into the gap 210 in the active filter region 228 of the filter die 212(2). The discontinuous channels 208(1) provide an additional volume and flow path to allow material to flow in and along the discontinuous channels 208(2) due to capillary flow. This redirects or reduces excess encapsulation material 218 (e.g., a mold material and/or a coating material) adjacent to the die edges 232(1)-232(4) from seeping into the air cavity 204 in the active filter region 228 of the filter die 212 (see also, FIG. 2A).

As shown in the partial top view of the filter die 212(2) in FIG. 2C-1, the discontinuous channels 208(2) extend continuously adjacent to the first die edge 232(1) and the third die edge 232(3) adjacent to and extending in an orthogonal direction (X-axis direction) to the direction (Y-axis direction) of the first die edge 232(1) to prevent or reduce the encapsulation material 218 from entering into or seeping into the active filter region 228 of the filter die 212(2) and into the air cavity 204 (see FIG. 2A). Note however that although not shown in FIG. 2C-1, the discontinuous channels 208(2) may extend continuously adjacent to each of the first, second, third, and fourth die edges 232(1)-232(4) of the filter die 212(2) to completely surround the active filter region 228 of the filter die 212(2).

The channel structures 236(2) may be comprised of a metal material or a dielectric material that can be fabricated or processed as a residual structure from the fabrication of the filter die 212(2) and/or the die package 200. For example, the channel structures 236(2) may be comprised of a photoresist material structure, dielectric material structure, metal structure, or passivation structure formed from a respective deposited photoresist film layer, dielectric layer, metal layer, or passivation layer that was formed on the second, bottom surface 226 of the filter die 212(2) as part of patterning openings for the UBMs 238. The channel structures 236(2) are formed between respective, adjacent die edges 232(1)-232(4) and metal bumps 224 and their respective UBMs 238 on the filter die 212(2) so that the discontinuous channels 208(2) are located in the inactive region 234 of the filter die 212(2).

Thus, as shown in FIGS. 2A and 2C-1-2C-2, the discontinuous channels 208(2) can redirect material, such as the encapsulation material 218, from entering the gap 210 adjacent to one or more of the die edges 232(1)-232(4) of the filter die 212(2), and thus redirecting and/or reducing material from entering the air cavity 204 in the active filter region 228 of the filter die 212(2). Providing the discontinuous channels 208(2) as the guard structure 202(2) can also avoid having to enlarge the die size of the filter die 212(2) to provide enough area in the gap 210 between one or more of die edges 232(1)-232(4) and the active filter region 228 of the filter die 212(2) to receive material to reduce or avoid such material seeping or entering into the air cavity 204 in the active filter region 228 of the filter die 212(2).

Figure 3:
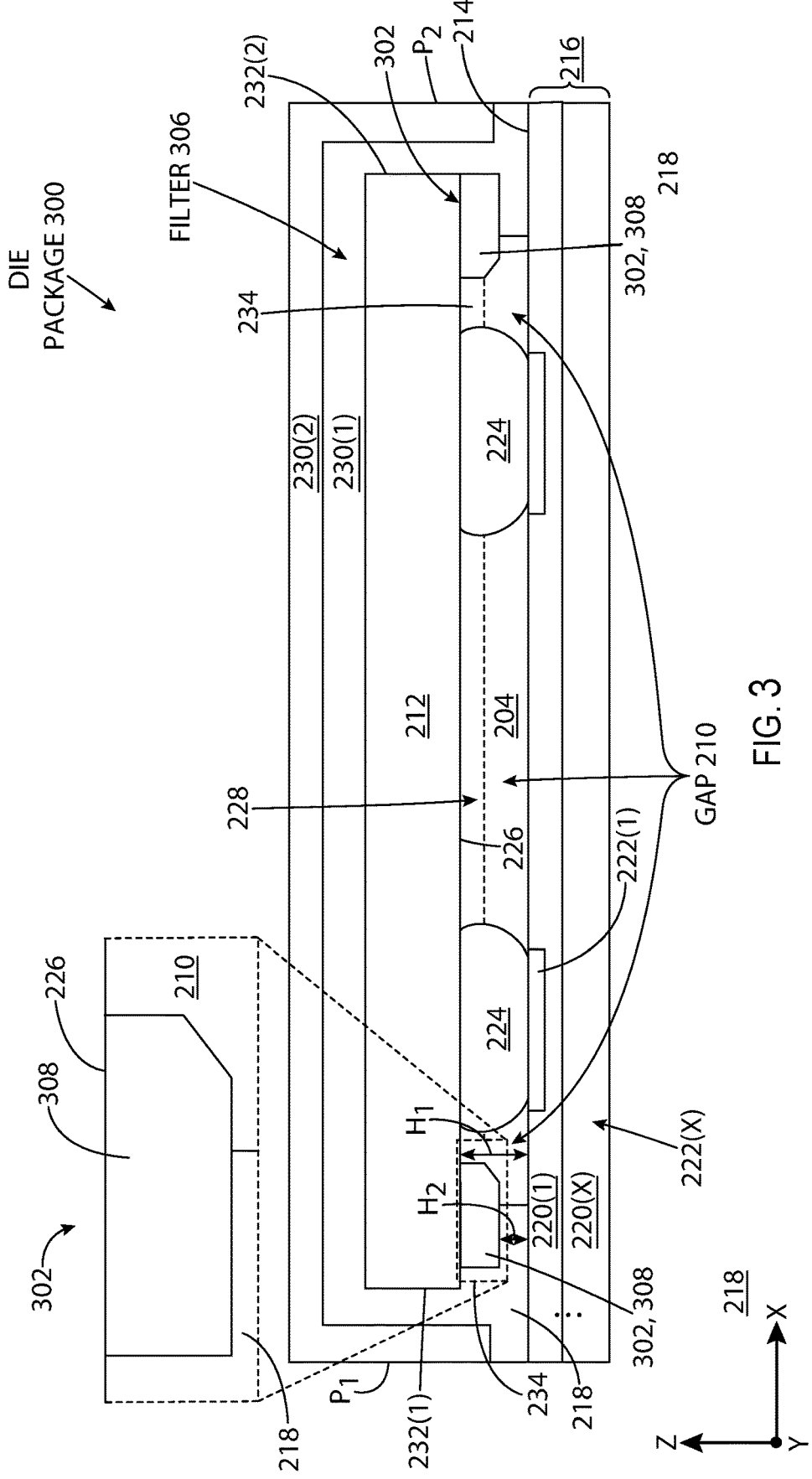
FIG. 3 is a side view of another exemplary die package that includes a filter that is a bare die filter that includes a die operable to be used in a filter ("filter die") coupled to a substrate with an air cavity formed in a gap between the filter die and the substrate, wherein the die package also includes a guard structure in the form of a raised structure in the gap to redirect material (e.g., an encapsulation material such as a mold material and/or a coating material) from entering or seeping into the air cavity of the filter.

FIG. 3 is a side view of another exemplary die package 300 that is a bare die package and that includes a filter 306 similar to the die package 200 in FIG. 2A. However, the die package 300 in FIG. 3 includes an alternative guard structure 302 in the form of a raised structure 308. Common elements between the die package 200 in FIG. 2A and the die package in FIG. 3 are shown with common element numbers. As discussed below, while the raised structure 308 does not include or form channels, the raised structure 308 can also redirect, prevent and/or reduce material (e.g., an encapsulation material such as a mold material and/or a coating material) from entering or seeping into the air cavity 204 of the filter die 212. This is because the raised structure 308 is coupled to and extends from the second, bottom surface 226 of the filter die 212 into the gap 210. In this example, the raised structure 308 also extends to the first and second die edges 232(1), 232(2) of the filter die 212 to intersect the respective planes $P_1$, $P_2$ (in the Y-Z axis plane) of the first and second die edges 232(1), 232(2) in the second, vertical direction (Z-axis direction).

As shown in FIG. 3, the raised structures 308 are between the respective first and second die edges 232(1), 232(2) of the filter die 212 and respective adjacent metal bumps 224 in the first, horizontal direction(s) (X-axis and/or Y-axis direction(s)) in an inactive region 234 of the filter 306. The filter 306 in this example is a bare die filter. Note that the raised structures 308 could just be located adjacent to one die edge, such as the first die edge 232(1). The raised structures 308 reduce the height $H_1$ of the gap 210 to a reduced height $H_2$ adjacent to the first and second die edges 232(1), 232(2) to reduce the area in which a material can enter into the gap 210 and possibly into the air cavity 204 in the active filter region 228 of the filter die 212. The reduced height $H_2$ of the gap 210 due to the raised structures 308 increases the resistance in the gap 210 adjacent to the first and second die edges 232(1), 232(2) to resist material from further entering into the gap 210 beyond the raised structures 308 in the horizontal direction(s) (X-axis and/or Y-axis direction(s)). Thus, the encapsulation material 218 present in the inactive region 234 in the gap 210 and adjacent to the raised structures 308 does not affect the acoustic properties of the air cavity 204 in the active filter region 228 of the filter 306 in this example.

In this example, the raised structures 308 can be a single raised structure 308 that extends around the entire inactive region 234 of the filter die 212 in a closed pattern. Alternatively, the raised structures 308 can be multiple, separate raised structures 308 that are strategically located in different and various areas adjacent to one or more die edges 232(1)-232(4) of the filter die 212.

Figure 4:
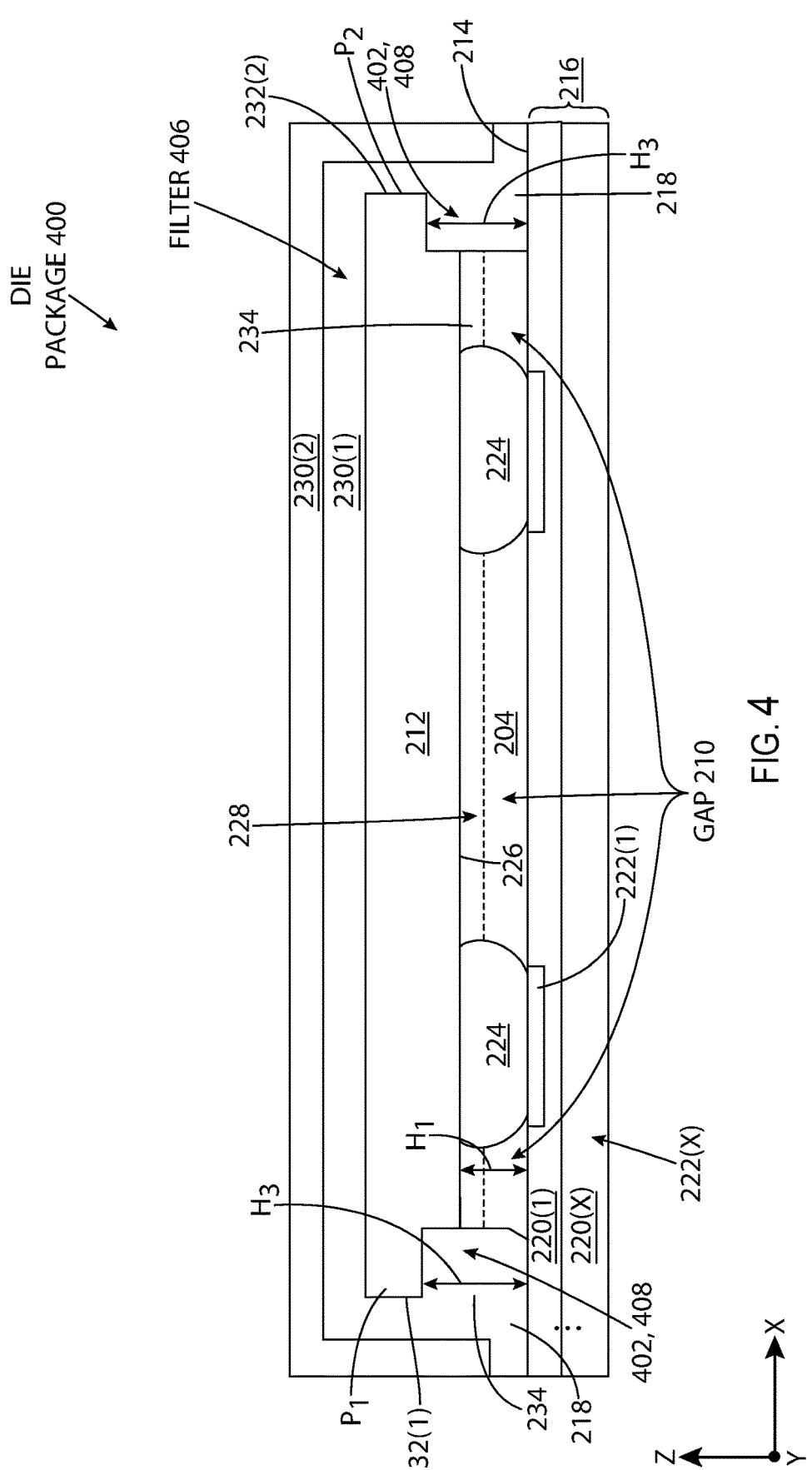
FIG. 4 is a side view of another exemplary die package that includes a filter that is a bare die filter that includes a die operable to be used in a filter ("filter die") coupled to a substrate with an air cavity formed in a gap between the filter die and the substrate, wherein the die package also includes a guard structure in the form of a die recess(es) in the die adjacent to and/or at one or more die edges of the filter die that redirects material (e.g., an encapsulation material such as a mold material and/or a coating material) from entering or seeping into the air cavity of the filter.

FIG. 4 is a side view of yet another exemplary die package 400 that is a bare die package and includes a filter 406 similar to the die package 300 in FIG. 3. However, the die package 400 in FIG. 4 includes an alternative guard structure 402 in the form of die recesses 408. Common elements between the die package 300 in FIG. 3 and the die package

400 in FIG. 4 are shown with common element numbers. As discussed below, while the die recesses 408 do not include or form channels, the die recesses 408 can also redirect and prevent and/or reduce material (e.g., an encapsulation material such as a mold material and/or a coating material) from entering or seeping into the air cavity 204 of the filter die 212. The die recesses 408 are formed in the filter die 212 adjacent to the gap 210. As an example, the die recesses 408 may be formed by performing a reserve die cut to the filter die 212 during its fabrication and/or assembly of the filter die 212 or die package 400. The die recesses 408 in this example are formed adjacent to and/or at one or more die edges 232(1), 232(2) of the filter die 212 and outside of the air cavity 204 in the active filter region 228 of the filter die 212. The die recesses 408 in the filter die 212 provide an additional volume of space as a type of reservoir that can receive and retain encapsulation material 218 (e.g., a mold material and/or a coating material). This can reduce or prevent such encapsulation material 218 from entering or seeping into the air cavity 204 in the active filter region 228 of the filter die 212. The additional volume of space provided by the die recesses 408 in the filter die 212 in essence provides an area of reduced resistance over the resistance of the gap 210 to cause the encapsulation material 218 to enter and remain outside of the air cavity 204 in the active filter region 228 of the filter die 212.

As shown in FIG. 4, the die recesses 408 are between the respective first and second die edges 232(1), 232(2) of the filter die 212 and respective adjacent metal bumps 224 in the first, horizontal direction(s) (X-axis and/or Y-axis direction(s)) in an inactive region 234 of the filter 406. In this example, the filter 406 is a bare die filter. In this example, the die recesses 408 also extend to the first and second die edges 232(1), 232(2) of the filter die 212 to intersect the respective planes $P_1$, $P_2$ (in the Y-Z axis plane) of the first and second die edges 232(1), 232(2) in the second, vertical direction (Z-axis direction). Note that the die recesses 408 could just be located adjacent to one die edge, such as the first die edge 232(1). The die recesses 408 increase the height $H_1$ of the gap 210 to an increased height $H_3$ adjacent to the first and second die edges 232(1), 232(2) to increase the area in which the encapsulation material 218 can enter into the gap 210 in the inactive region 234 of the filter die 212 and thus reducing the possibility of such encapsulation material 218 entering into the air cavity 204 in the active filter region 228 of the filter die 212. The increased height $H_3$ of the gap 210 in the inactive region 234 due to the die recesses 408 decreases the resistance in the gap 210 adjacent to the first and second die edges 232(1), 232(2) to encourage material from the top to enter into the die recesses 408. Thus, the encapsulation material 218 present in the inactive region 234 in the gap 210 and in the die recesses 408 and adjacent to the die edges 232(1), 232(2) does not affect the acoustic properties of the air cavity 204 in the active filter region 228 of the filter 406 in this example.

In this example, the die recesses 408 can be a single die recess 408 that extends around the entire inactive region 234 of the filter die 212 in a closed pattern. Alternatively, the die recesses 408 can be multiple, separate die recesses 408 that are strategically located in different and various areas cut or otherwise formed in the second, bottom surface 226 of the filter die 212 adjacent to one or more die edges 232(1)-232(4) of the filter die 212.

FIG. 5 is a flowchart illustrating an exemplary fabrication process 500 of fabricating a die package that includes a filter that includes a die operable to be used as a filter ("filter die") coupled to a substrate with an air cavity formed in a gap between the filter die and the substrate, wherein the die package also includes a guard structure to redirect material (e.g., an encapsulation material such as a mold material and/or a coating material) from entering or seeping into the air cavity of the filter, including, but not limited to, the die packages 200, 300, 400 in FIGS. 2A, 2B-1-2B-2, 2C-1-2C-2, 3, and 4. The fabrication process 500 in FIG. 5 is described with regard to any of the die packages 200, 300, 400 in FIGS. 2A-4. Note however that the fabrication process 500 in FIG. 5 can also be employed to fabricate other die packages that include a filter that includes a filter die coupled to a substrate with an air cavity formed in a gap between the filter die and the substrate, wherein the die package also includes a guard structure to redirect material (e.g., an encapsulation material such as a mold material and/or a coating material) from entering or seeping into the air cavity of the filter.

In this regard, as shown in FIG. 5, a first exemplary step in the fabrication process 500 in this example is providing a substrate 216 comprising a first surface 214 (block 502 in FIG. 5). Another exemplary step in the fabrication process 500 is providing a filter die 212, 212(1), 212(2) comprising a second surface 226, a plurality of die edges 232(1)-232(4) adjacent to the second surface 226, and a plurality of metal bumps 224 coupled to the second surface 226 (block 504 in FIG. 5). Another exemplary step in the fabrication process 500 is forming one or more guard structures 202, 202(1), 202(2), 302, 402 on the filter die 212, 212(1), 212(2) and adjacent to a first die edge 232(1) of the plurality of die edges 232(1)-232(4) (block 506 in FIG. 5). Another exemplary step in the fabrication process 500 is coupling the plurality of metal bumps 224 to the first surface 214 of the substrate 216 forming an air cavity 204 in a gap 210 between the first surface 214 and the filter die 212, 212(1), 212(2) and disposing the one or more guard structures 202, 202(1), 202(2), 302, 402 adjacent to the gap 210 (block 508 in FIG. 5).

A die package that includes a filter that includes a die operable to be used as a filter ("filter die") coupled to a substrate with an air cavity formed in a gap between the filter die and the substrate, wherein the die package also includes a guard structure to redirect material (e.g., an encapsulation material such as a mold material and/or a coating material) from entering or seeping into the air cavity of the filter, including, but not limited, to the die packages 200, 300, 400 in FIGS. 2A, 2B-1-2B-2, 2C-1-2C-2, 3, and 4, can be fabricated in other fabrication processes.

Figures 6, 7A, 7B:
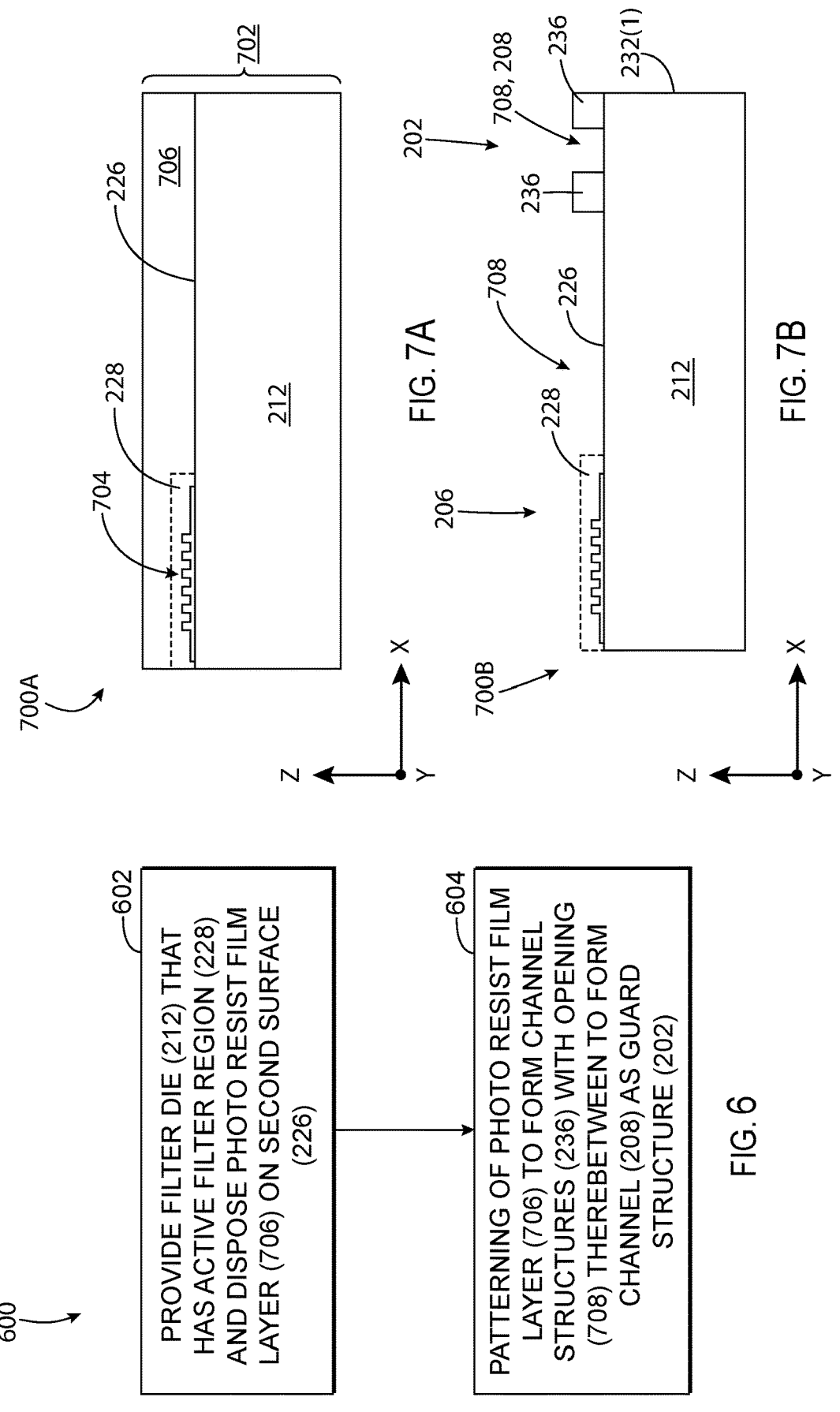
FIG. 6 is a flowchart illustrating another exemplary fabrication process of patterning a guard structure for a die operable to be used in a filter using a photoresist material structure formed from a photoresist film layer in FIG. 2A.
FIGS. 7A-7B illustrate exemplary fabrication stages according to the exemplary fabrication process in FIG. 6.
Figures 8A, 9A, 9B:
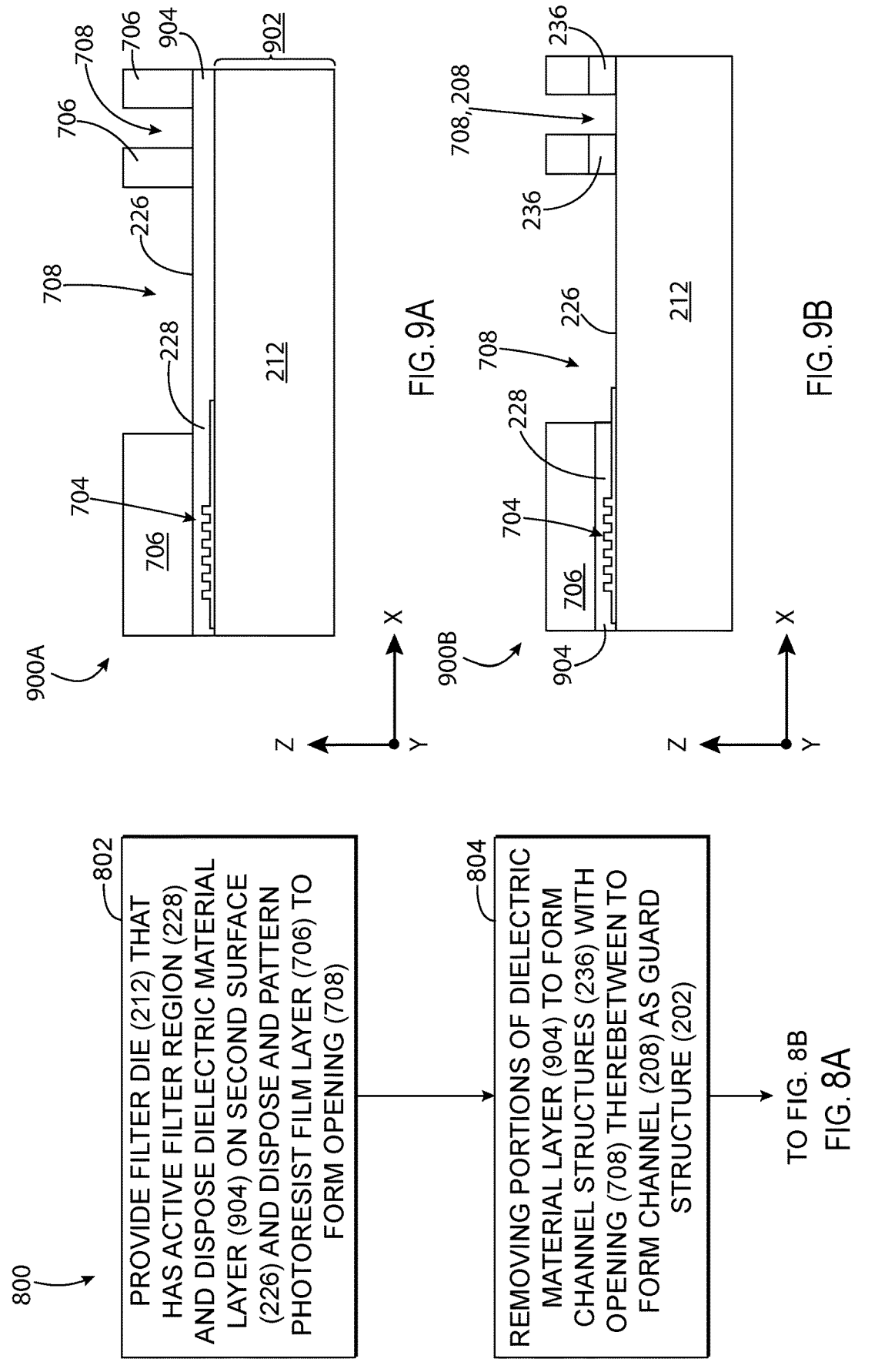
FIGS. 8A-8B is a flowchart illustrating another exemplary fabrication process of patterning a guard structure for a filter die in FIG. 2A as a dielectric material structure formed from a dielectric layer.
FIGS. 9A-9C illustrate exemplary fabrication stages according to the exemplary fabrication process in FIGS. 8A and 8B.
Figures 8B, 9C:
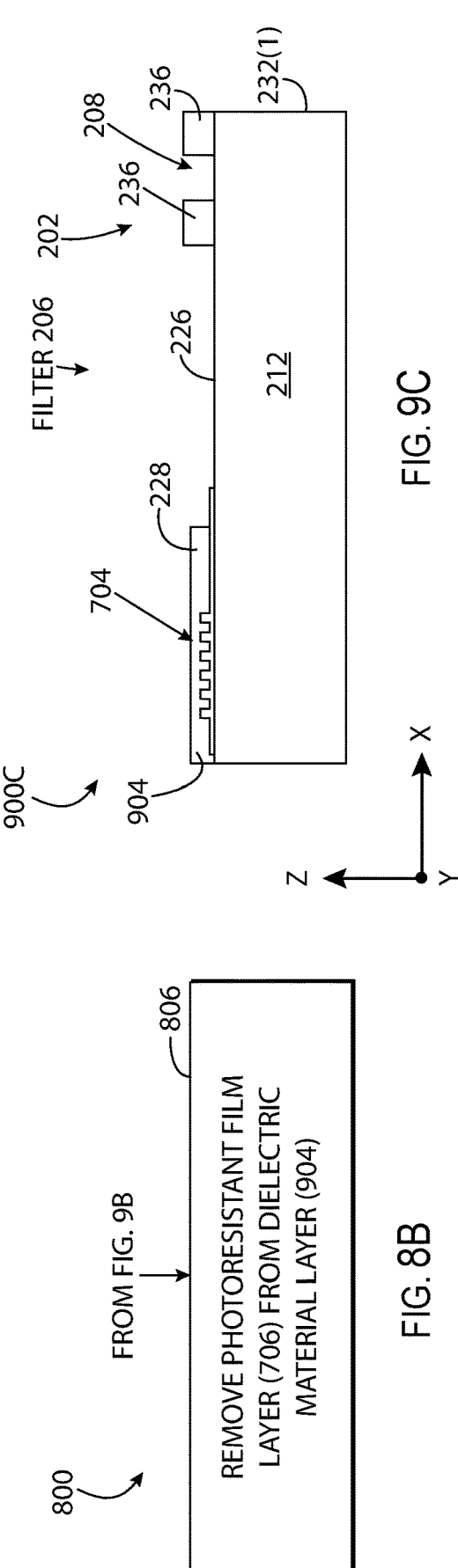
Figures 10A, 11A, 11B:
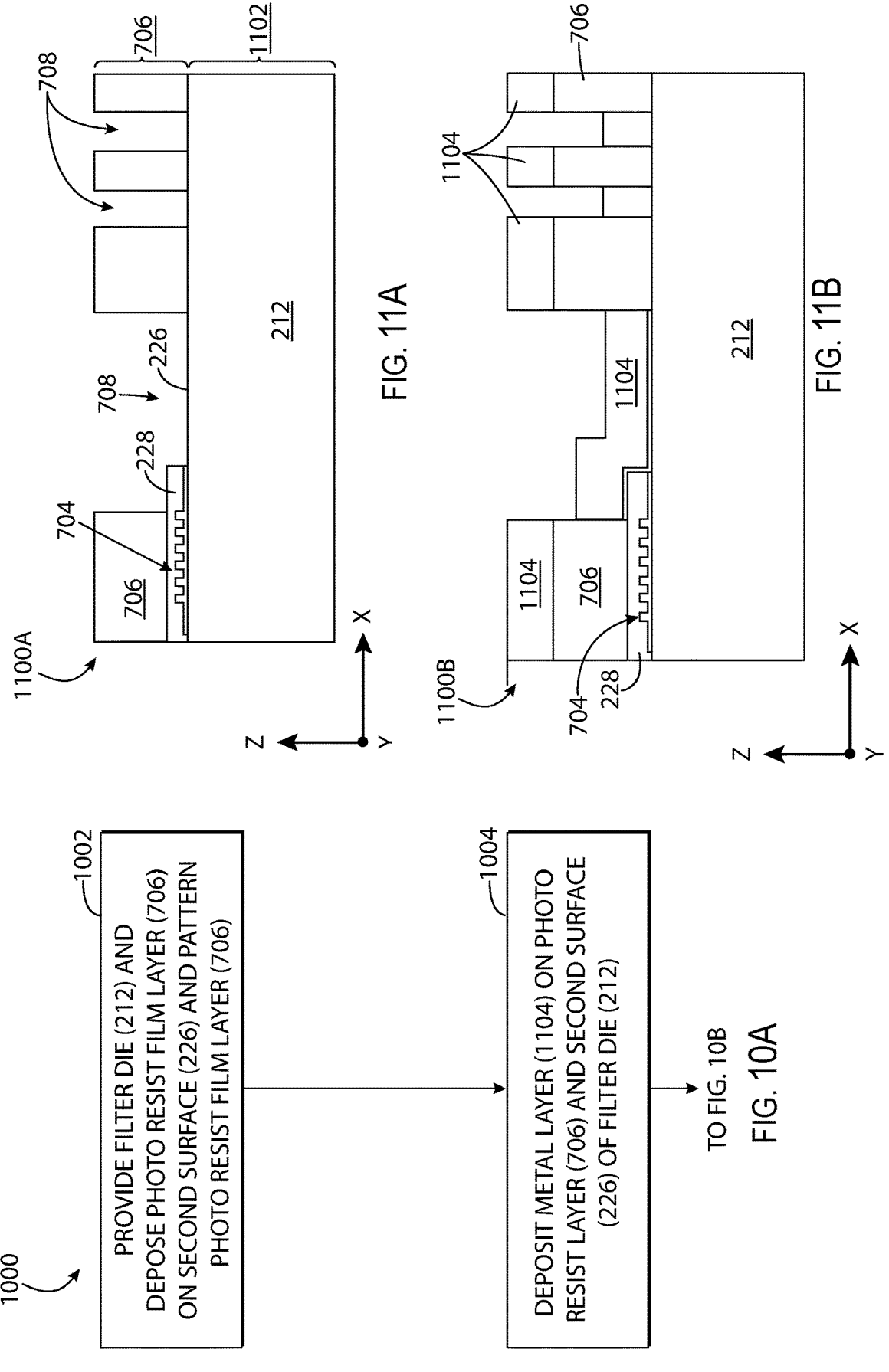
FIGS. 10A-10B is a flowchart illustrating another exemplary fabrication process of patterning a guard structure for a filter die in FIG. 2A as a metal structure formed from a metal layer.
FIGS. 11A-11C illustrate exemplary fabrication stages according to the exemplary fabrication process in FIGS. 10A and 10B.
Figures 10B, 11C:
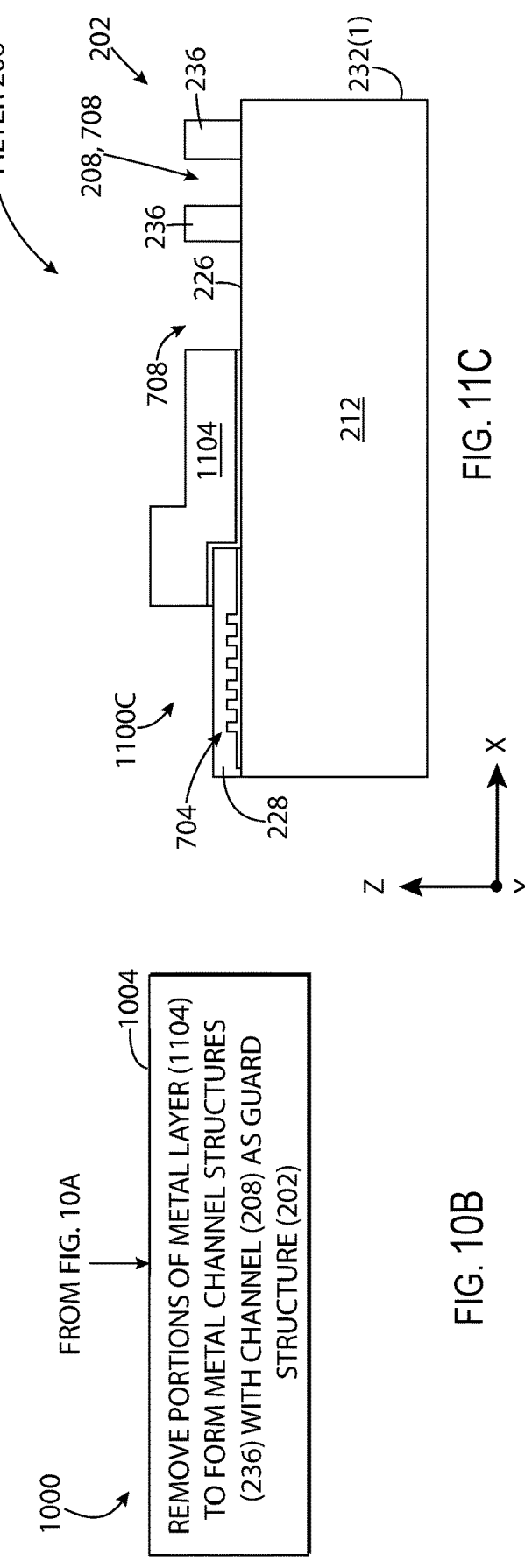
Figures 12A, 13A, 13B:
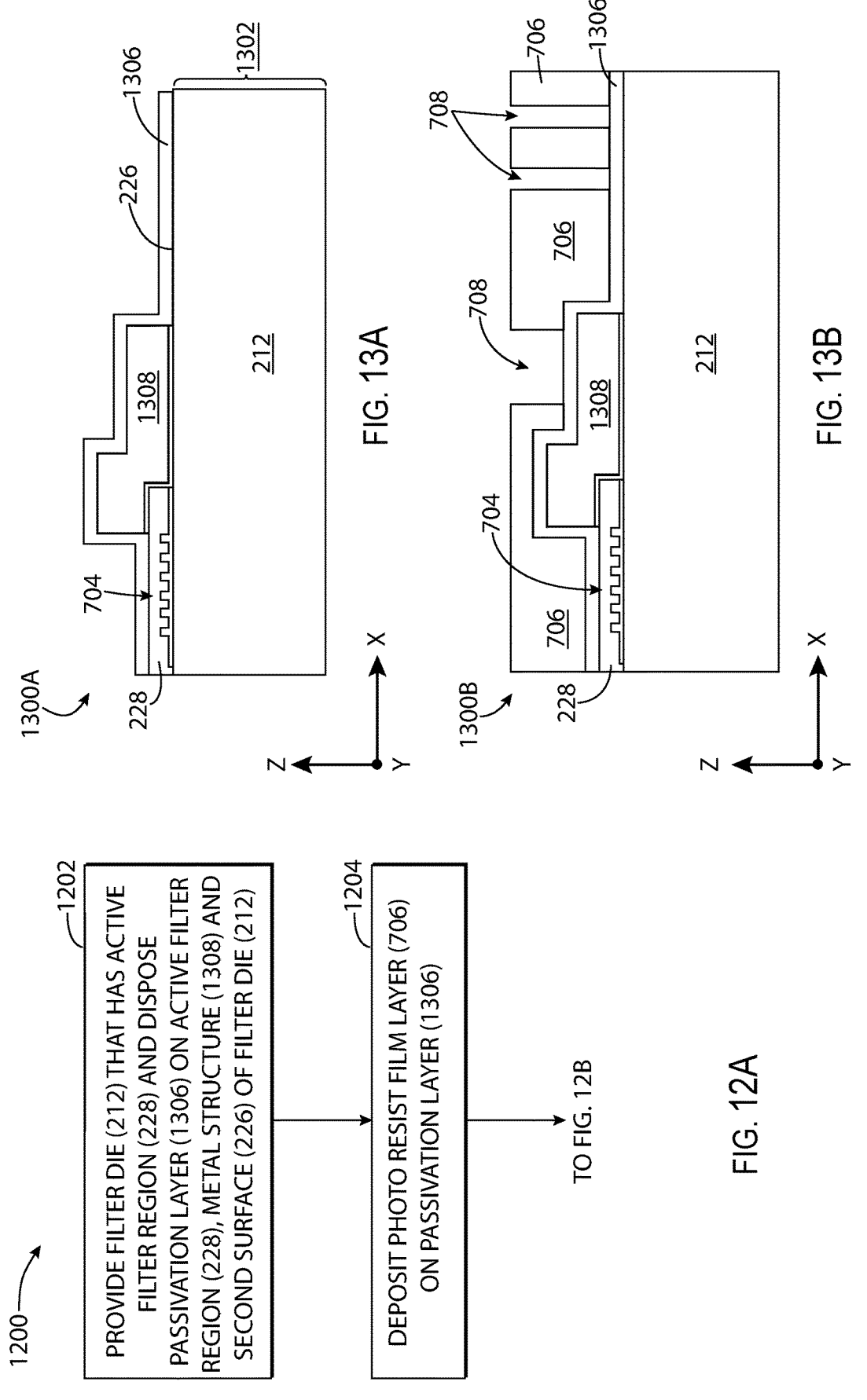
FIGS. 12A-12B is a flowchart illustrating another exemplary fabrication process of patterning a guard structure for a filter die in FIG. 2A as a passivation structure formed from a passivation layer.
FIGS. 13A-13D illustrate exemplary fabrication stages according to the exemplary fabrication process in FIGS. 12A-12B.
Figures 12B, 13C, 13D:
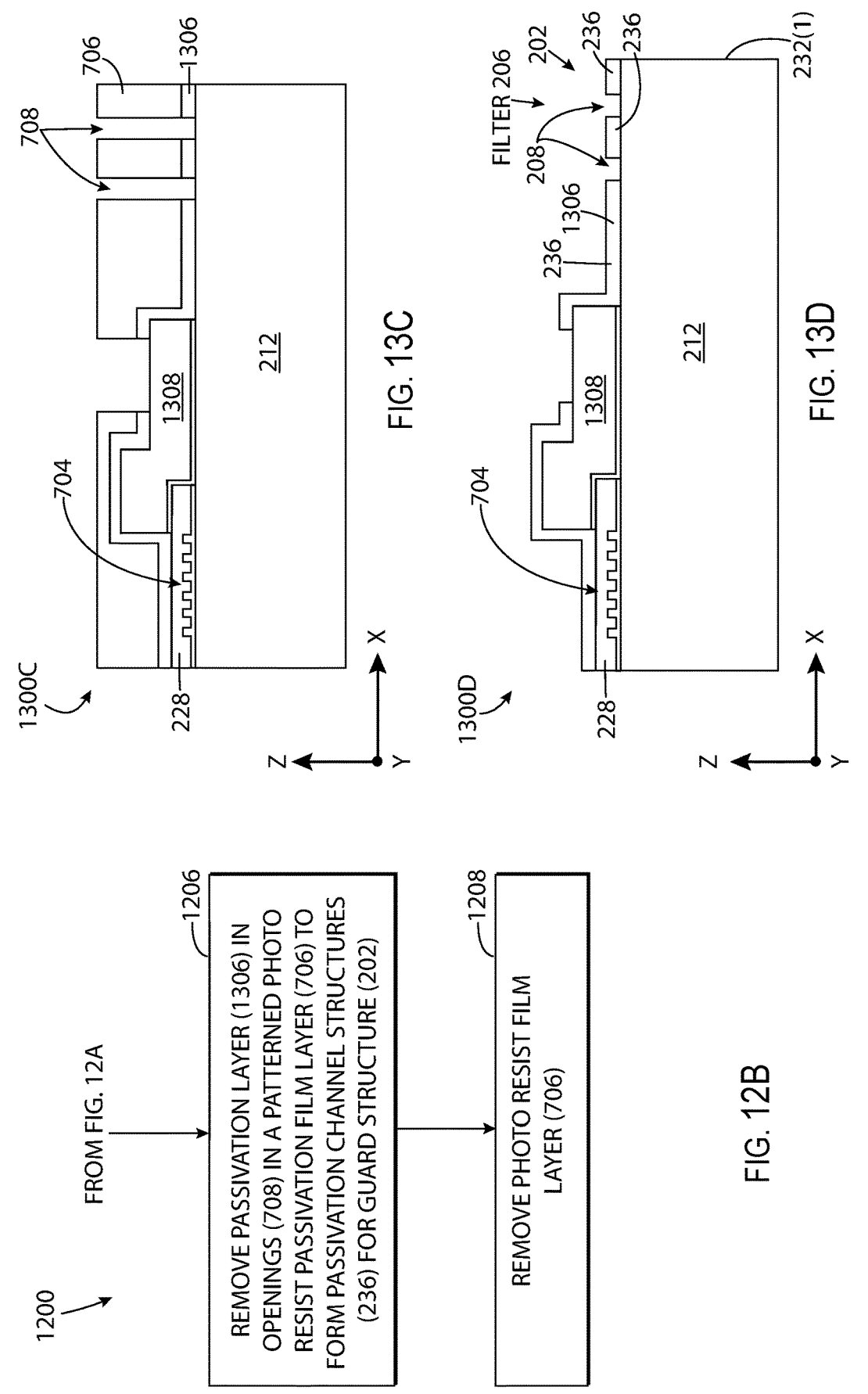

For example, FIGS. 6, 8A-8B, 10A-10B, and 12A-12B are flowcharts illustrating other exemplary alternative fabrication processes 600, 800, 1000, 1200 of fabricating a die package with a guard structure like in the die package 200 in FIGS. 2A-2C-2. The fabrication process 600 in FIG. 6 is a process to pattern a guard structure for a die operable to be used as a filter ("filter die") as a photoresist film structure formed from a photoresist film layer. FIGS. 7A-7B illustrate exemplary fabrication stages 700A-700B according to the exemplary fabrication process 600 in FIG. 6. The fabrication process 800 in FIGS. 8A-8B is a process to pattern a guard structure for a die operable to be used as a filter ("filter die") as a dielectric material structure formed from a dielectric layer. FIGS. 9A-9C illustrate exemplary fabrication stages 900A-900C according to the exemplary fabrication process 800 in FIGS. 8A-8B. The fabrication process 1000 in FIGS. 10A-10B is a process to pattern a guard structure for a die operable to be used as a filter ("filter die") as a metal structure formed from a metal layer. FIGS. 11A-11C illustrate exemplary fabrication stages 1100A-1100C according to the exemplary fabrication process 1000 in FIGS. 10A-10B. The fabrication process 1200 in FIGS. 12A-12B is a process to pattern a guard structure for a die operable to be used as a filter ("filter die") as a passivation structure formed from a passivation layer. FIGS. 13A-13D illustrate exemplary fabrication stages 1300A-1300D according to the exemplary fabrication process 1200 in FIGS. 12A-12B.

The fabrication processes 600, 800, 1000, 1200 in FIGS. 6, 8A-8B, 10A-10B, and 12A-12B will now be discussed using the example of the die package 200 in FIG. 2A. However, note that the discussion of the fabrication processes 600, 800, 1000, 1200 in FIGS. 6, 8A-8B, 10A-10B, and 12A-12B is not limited to fabricating the die package 200 in FIG. 2A.

In this regard, as illustrated in the exemplary fabrication stage 700A in FIG. 7A, an exemplary step in the fabrication process 600 to pattern a guard structure for a die operable to be used as a filter ("filter die") as a photoresist film structure formed from a photoresist film layer can be to provide the filter die 212 that has the active filter region 228 (block 602 in FIG. 6). The filter die 212 can be provided as part of a semiconductor wafer 702 that includes a plurality of filter dies 212 that will eventually be diced. The active filter region 228 is an area of the filter die 212 that includes a circuit 704 and/or filtering material on the second, bottom surface 226 of the filter die 212 (i.e., a piezoelectric material) involved in filtering signals. A photoresist film layer 706 is deposited on the active filter region 228 and the second, bottom surface 226 of the filter die 212 to prepare for patterning of the photoresist film layer 706 that will be eventually used to form the channel(s) 208 of the guard structure 202 (block 602 in FIG. 6). The photoresist film layer 706 is then patterned and a portion of the photoresist film layer 706 removed to form adjacent, parallel channel structures 236, with the channel 208 formed in opening 708 between the channel structures 236 as a guard structure 202 (block 604 in FIG. 6).

Note that FIG. 7B only shows one channel 208 formed for the guard structure 202; however, the photoresist film layer 706 could be patterned to form multiple channels like the channels 208, 208(1), 20(2) shown in FIGS. 2A, 2B-1, and/or 2C-1 as examples. Also note that alternatively, the photoresist film layer 706 could be patterned to form one (1) channel structure 236, such as adjacent to the die edge 232(1) to form a raised structure as a guard structure like in the die package 300 in FIG. 3.

As illustrated in the exemplary fabrication stage 900A in FIG. 9A, an exemplary step in the fabrication process 800 to pattern a guard structure for a die operable to be used as a filter ("filter die") as a dielectric material structure formed from a dielectric material layer can be to provide the filter die 212 that has the active filter region 228 (block 802 in FIG. 8A). The filter die 212 can be provided as part of semiconductor wafer 902 that includes a plurality of filter dies 212 that will eventually be diced. A dielectric layer 904 is deposited on the active filter region 228 and the second, bottom surface 226 of the filter die 212 to prepare for patterning of the dielectric layer 904 that will be eventually used to form the channel(s) 208 of the guard structure 202 (block 802 in FIG. 8A). The photoresist film layer 706 is then deposited on the dielectric layer 904 and patterned to form the opening 708 in the photoresist film layer 706 to prepare for patterning of the dielectric layer 904 that will be eventually used to form the channels 208 of the guard structure 202 (block 802 in FIG. 8A). The patterning of the photoresist film layer 706 can involve exposing the photoresist film layer 706 with a mask and developing the photoresist film layer 706. Portions of the dielectric layer 904 are then removed (e.g., using etching, dry etching, etc.) using the patterning of the photoresist film layer 706 to expand the opening 708 formed in the photoresist film layer 706. Then, as shown in fabrication stage 900B in FIG. 9B, a portion of the dielectric layer 904 is removed to form adjacent, parallel channel structures 236 expanded into the dielectric layer 904 with the channel 208 formed in the opening 708 between the channel structures 236 as a guard structure 202 (block 804 in FIG. 8A). Then, as shown in fabrication stage 900C in FIG. 9C, the photoresist film layer 706 can be removed from the dielectric layer 904 leaving the filter die 212 with the guard structure 202 formed thereon (block 806 in FIG. 8B).

Note that FIG. 9C only shows one channel 208 formed for the guard structure 202; however, the photoresist film layer 706 could be patterned to form multiple channels like the channels 208, 208(1), 208(2) shown in FIGS. 2A, 2B-1, and/or 2C-1 as examples. Also note that alternatively, the dielectric layer 904 could be patterned to form one (1) channel structure 236, such as adjacent to the die edge 232(1) to form a raised structure as a guard structure like in the die package 300 in FIG. 3.

As illustrated in the exemplary fabrication stage 1100A in FIG. 11A, an exemplary step in the fabrication process 1000 to pattern a guard structure for a die operable to be used as a filter ("filter die") as a metal structure formed from a metal layer can be to provide the filter die 212 that has the active filter region 228 (block 1002 in FIG. 10A). The filter die 212 can be provided as part of semiconductor wafer 1102 that includes a plurality of filter dies 212 that will eventually be diced. A photoresist film layer 706 is deposited on the active filter region 228 and the second, bottom surface 226 of the filter die 212 to prepare for patterning of a metal layer that will be eventually used to form the channel(s) 208 of the guard structure 202 (block 1002 in FIG. 10A). The photoresist film layer 706 is then patterned to form the openings 708 in the photoresist film layer 706 that will be eventually used to form the channels 208 of the guard structure 202 (block 1002 in FIG. 10A). The patterning of the photoresist film layer 706 can involve exposing the photoresist film layer 706 with a mask and developing the photoresist film layer 706. Then, as shown in the exemplary fabrication stage 1100B in FIG. 11B, a metal layer 1104 is deposited on the photoresist film layer 706 that was not removed and in the openings 708 (block 1004 in FIG. 10A). This is to prepare a metal material deposited in the opening 708 to form a guard structure 202. Then, as shown in the exemplary fabrication stage 1100C in FIG. 11C, the metal layer 1104 is removed where present on the photoresist film layer 706 along with the photoresist film layer 706. This leaves portions of the metal layer 1104 to form adjacent, parallel channel structures 236 wherein the channel 208 is formed in the opening 708 between the channel structures 236 as a guard structure 202 (block 1006 in FIG. 10B).

Note that FIG. 11C only shows one channel 208 formed for the guard structure 202; however, the metal layer 1104 could be patterned to form multiple channels like the channels 208, 208(1), 208(2) shown in FIGS. 2A, 2B-1, and/or 2C-1 as examples. Also note that alternatively, the metal layer 1104 could be patterned to form one (1) channel structure 236, such as adjacent to the die edge 232(1) to form a raised structure as a guard structure like in the die package 300 in FIG. 3.

As illustrated in the exemplary fabrication stage 1300A in FIG. 13A, an exemplary step in the fabrication process 1200 to pattern a guard structure for a die operable to be used as a filter ("filter die") as a passivation structure formed from a passivation layer can be to provide the filter die 212 that has the active filter region 228 (block 1202 in FIG. 12A). The filter die 212 can be provided as part of semiconductor wafer 1302 that includes a plurality of filter dies 212 that will eventually be diced. A passivation layer 1306 is deposited on the active filter region 228, a metal structure 1308 formed on the second, bottom surface 226 of the filter die 212 adjacent to the active filter region 228, and the second, bottom surface 226 of the filter die 212 to prepare for patterning of a metal layer that will be eventually used to form the channel(s) 208 of the guard structure 202 (block 1202 in FIG. 12A). Then, as shown in the exemplary fabrication stage 1300B in FIG. 13B, a photoresist film layer 706 is then deposited on the passivation layer 1306 and then patterned to form the openings 708 in the photoresist film layer 706 to prepare for patterning of the passivation layer 1306 that will be eventually used to form the channels 208 of the guard structure 202 (block 1204 in FIG. 12A). The patterning of the photoresist film layer 706 can involve exposing the photoresist film layer 706 with a mask and developing the photoresist film layer 706.

Then, as shown in the exemplary fabrication stage 1300C in FIG. 13C, the passivation layer 1306 is removed where present in the openings 708 in the photoresist film layer 706. This leave portions of the passivation layer 1306 to form adjacent, parallel channel structures 236 with the channel 208 formed in the opening 708 between the channel structures 236 as a guard structure 202 (block 1206 in FIG. 12B). Then, as shown in the exemplary fabrication stage 1300D in FIG. 13D, the photoresist film layer 706 is removed (block 1208 in FIG. 12B).

Note that FIG. 13D only shows two channels 208 formed for the guard structure 202; however, the passivation layer 1306 could be patterned to form one or more than two channels like the channels 208, 208(1), 208(2) shown in FIGS. 2A, 2B-1, and/or 2C-1 as examples. Also note that alternatively, the passivation layer 1306 could be patterned to form one (1) channel structure 236, such as adjacent to the die edge 232(1) to form a raised structure as a guard structure like in the die package 300 in FIG. 3.

Figures 14A, 15A, 15B:
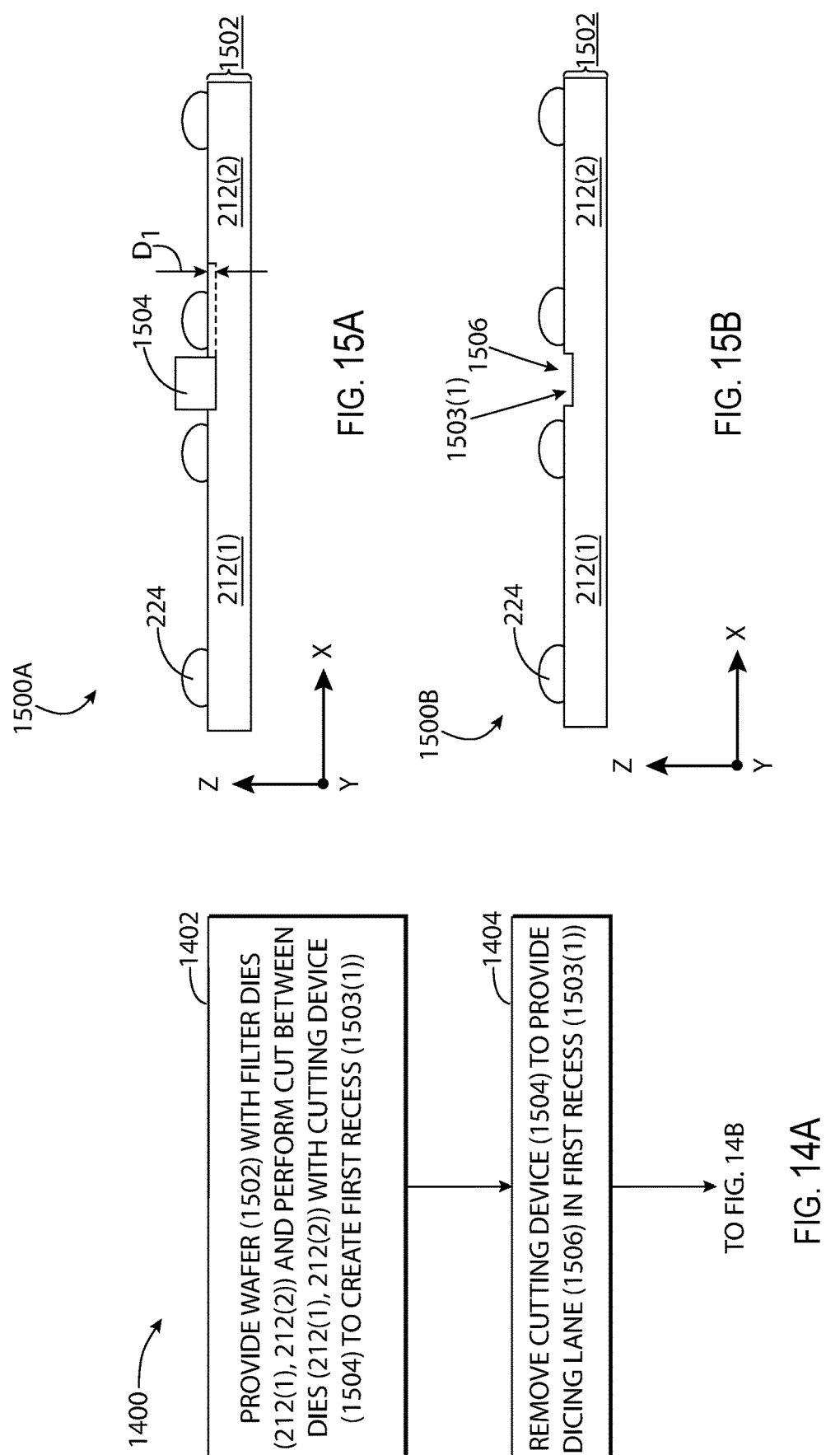
FIGS. 14A-14C is a flowchart illustrating another exemplary fabrication process of fabricating the die package in FIG. 4 with a guard structure in the form of a die recess.
FIGS. 15A-15F illustrate exemplary fabrication stages according to the exemplary fabrication process in FIGS. 14A-14C.
Figures 14B, 15C, 15D:
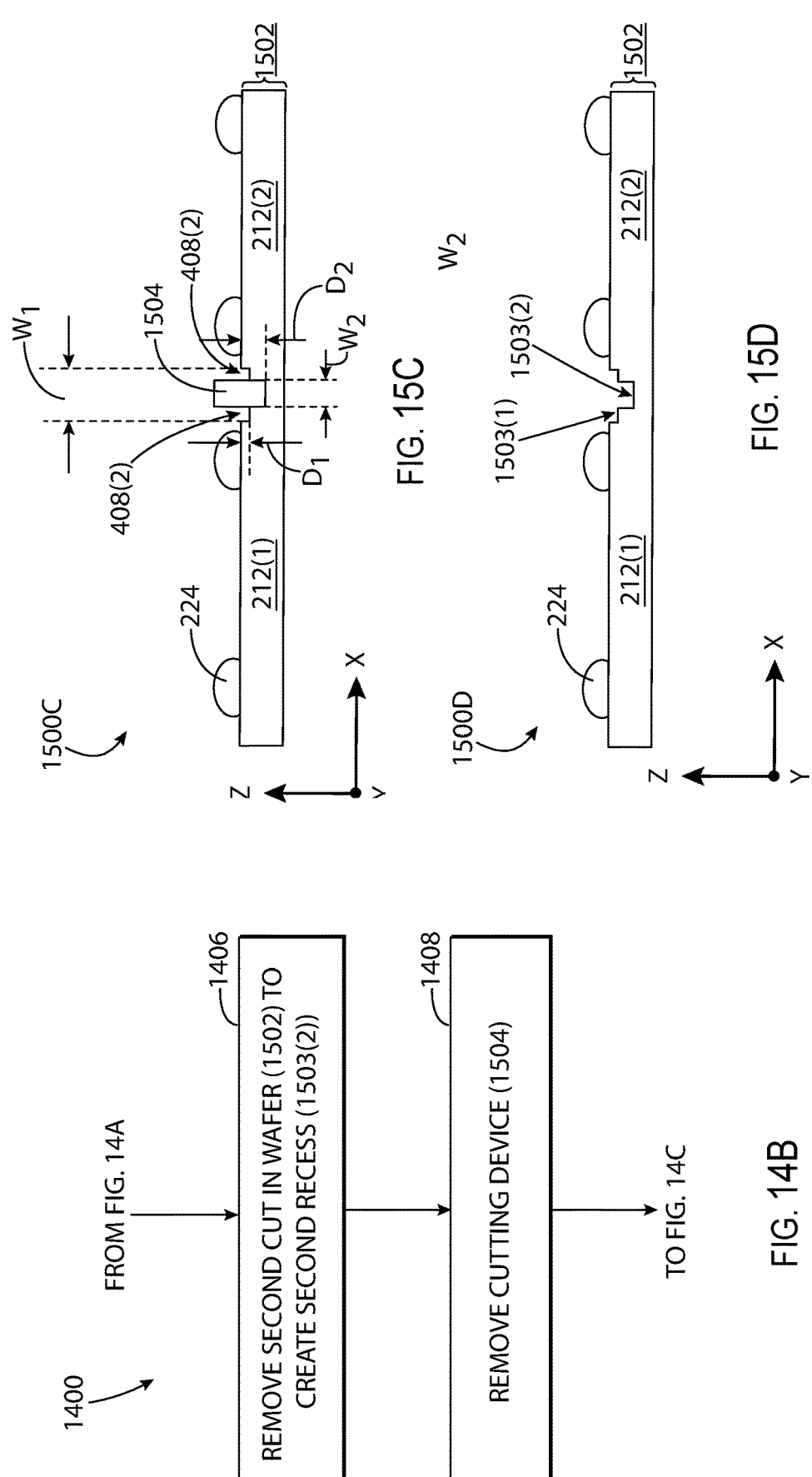
Figures 14C, 15E, 15F:
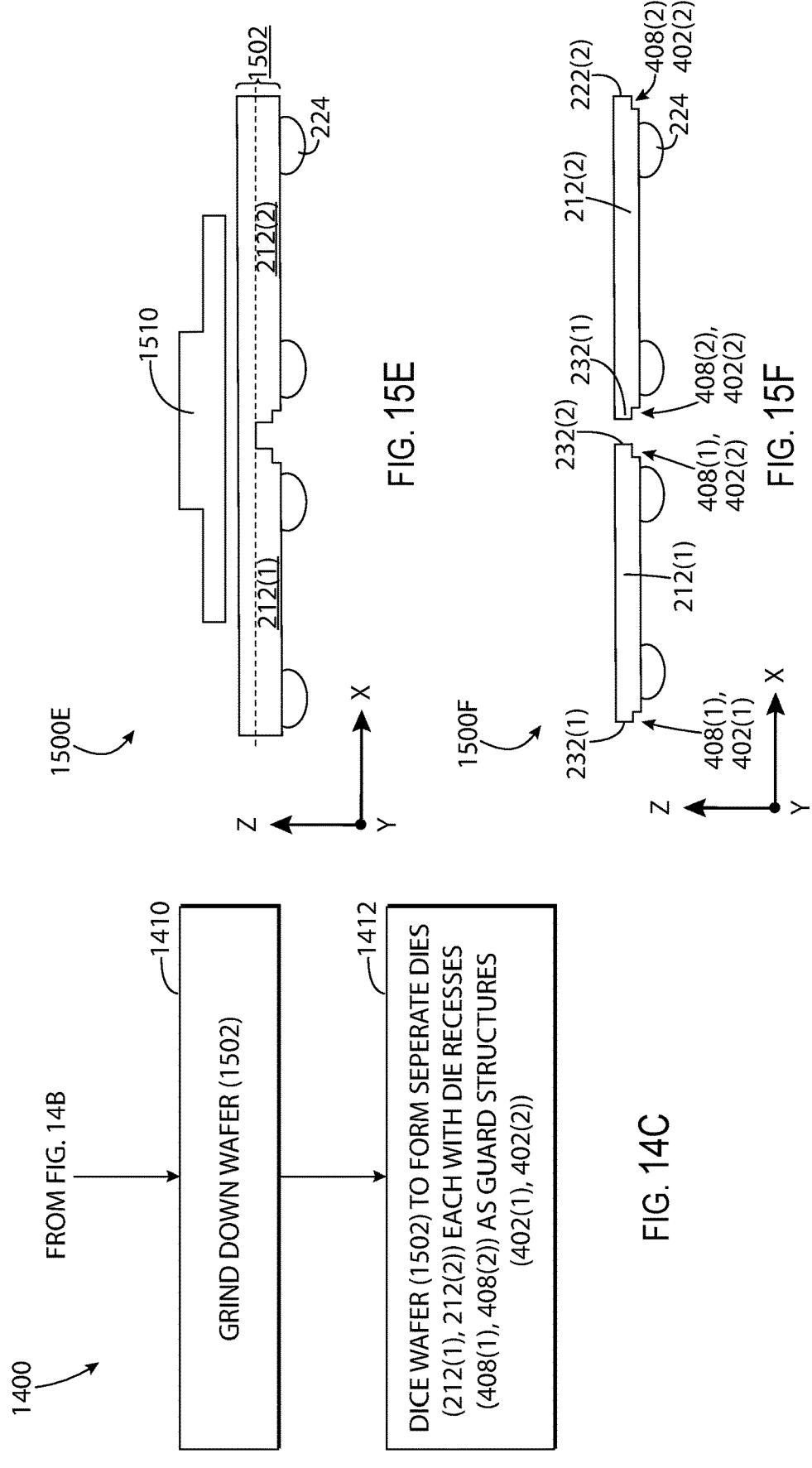

FIGS. 14A-14C is a flowchart illustrating another exemplary alternative fabrication processes 1400 of fabricating a die package with a guard structure in the form of a die recess(es) like provided in the die package 400 in FIG. 4. FIGS. 15A-15F illustrate exemplary fabrication stages 1500A-1500F according to the exemplary fabrication process 1400 in FIGS. 14A-14C. The fabrication process 1400 in FIGS. 14A-14C will now be discussed using the example of the die package 400 in FIG. 4. However, note that the discussion of the fabrication process in FIGS. 14A-14C is not limited to fabricating the die package 400 in FIG. 4.

In this regard, as shown in the exemplary fabrication stage 1500A in FIG. 15A, a first step of fabrication of the die package 400 in FIG. 4 is to provide a wafer 1502 that includes a plurality of filter dies 212(1), 212(2) that are like the filter die 212 in FIG. 4, and then perform a cut in the second, vertical direction (Z-axis direction) with a cutting device 1504 (e.g., a laser or dicing blade) between the filter dies 212(1), 212(2) in the first, horizontal direction to create a first recess 1503(1) (block 1402 in FIG. 14A). The cut is not performed through the entire wafer 1502, but to a first depth $D_1$. The cutting device 1504 is then removed, and the residual cut in the wafer 1502 is to provide a dicing lane 1506 for eventual dicing of the filter dies 212(1), 212(2), as shown in the exemplary fabrication stage 1500B in FIG. 15B (block 1404 in FIG. 14B).

Then, as shown in the exemplary fabrication stage 1500C in FIG. 15C, a next step of fabrication can be to perform a second cut in the second, vertical direction (Z-axis direction) in the dicing lane 1506 with the same or a different cutting device 1504 (e.g., a laser) that is at a second depth $D_2$ greater than the first depth $D_1$ to create a second recess 1503(2) (block 1406 in FIG. 14B). This second cut provides the eventual die recesses 408(1), 408(2) that will be provided in the filter dies 212(1), 212(2) to provide a guard structure like the guard structures 402 shown in the die package 400 in FIG. 4. The second cut is also of a reduced width $W_2$ over the first width $W_1$ of the first cut to provide separate die recesses 408(1), 408(2) from the second recess 1503(3) in the respective filter dies 212(1), 212(2) after the filter dies 212(1), 212(2) are diced. The cutting device 1504 is then removed, as shown in the exemplary fabrication stage 1500D in FIG. 15D (block 1408 in FIG. 14B).

Then, as shown in the exemplary fabrication stage 1500E in FIG. 15E, a next step of fabrication can include grinding down the wafer 1502 with a grinding device 1510 to prepare the wafer 1502 to be diced (block 1410 in FIG. 14C). Then, as shown in the exemplary fabrication stage 1500F in FIG. 15F, a next step of fabrication can include dicing the wafer 1502 to form the separate filter dies 212(1), 212(2) each having a residual respective die recess 408(1), 408(2) as respective guard structures 402(1), 402(2) (block 1412 in FIG. 14C). Note that the die recesses 408(1), 408(2) could also extend to each respective die edge 232(1), 232(2) of the filter dies 212(1), 212(2).

A die package that includes a filter that includes a die operable to be used as a filter ("filter die") coupled to a substrate with an air cavity formed in a gap between the filter die and the substrate, wherein the die package also includes a guard structure to redirect material (e.g., an encapsulation material such as a mold material and/or a coating material) from entering or seeping into the air cavity of the filter, including, but not limited to, the die packages 200, 300, 400 in FIGS. 2A, 2B-1-2B-2, 2C-1-2C-2, 3, and 4, herein can be provided as a CSP, BDMP and/or systems-in-a-package (SiP) as examples.

Further, a die package that includes a filter that includes a die operable to be used as a filter ("filter die") coupled to a substrate with an air cavity formed in a gap between the filter die and the substrate, wherein the die package also includes a guard structure to redirect material (e.g., an encapsulation material such as a mold material and/or a coating material) from entering or seeping into the air cavity of the filter, including, but not limited to, the die packages 200, 300, 400 in FIGS. 2A, 2B-1-2B-2, 2C-1-2C-2, 3, 4, 7B, 9C, 11C, 13D, and 15F and fabricated according to any of the exemplary fabrication processes 500, 600, 800, 1000, 1200, 1400 in FIGS. 5-6, 8A-8B, 10A-10B, 12A-12B, and 14A-14C, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 16:
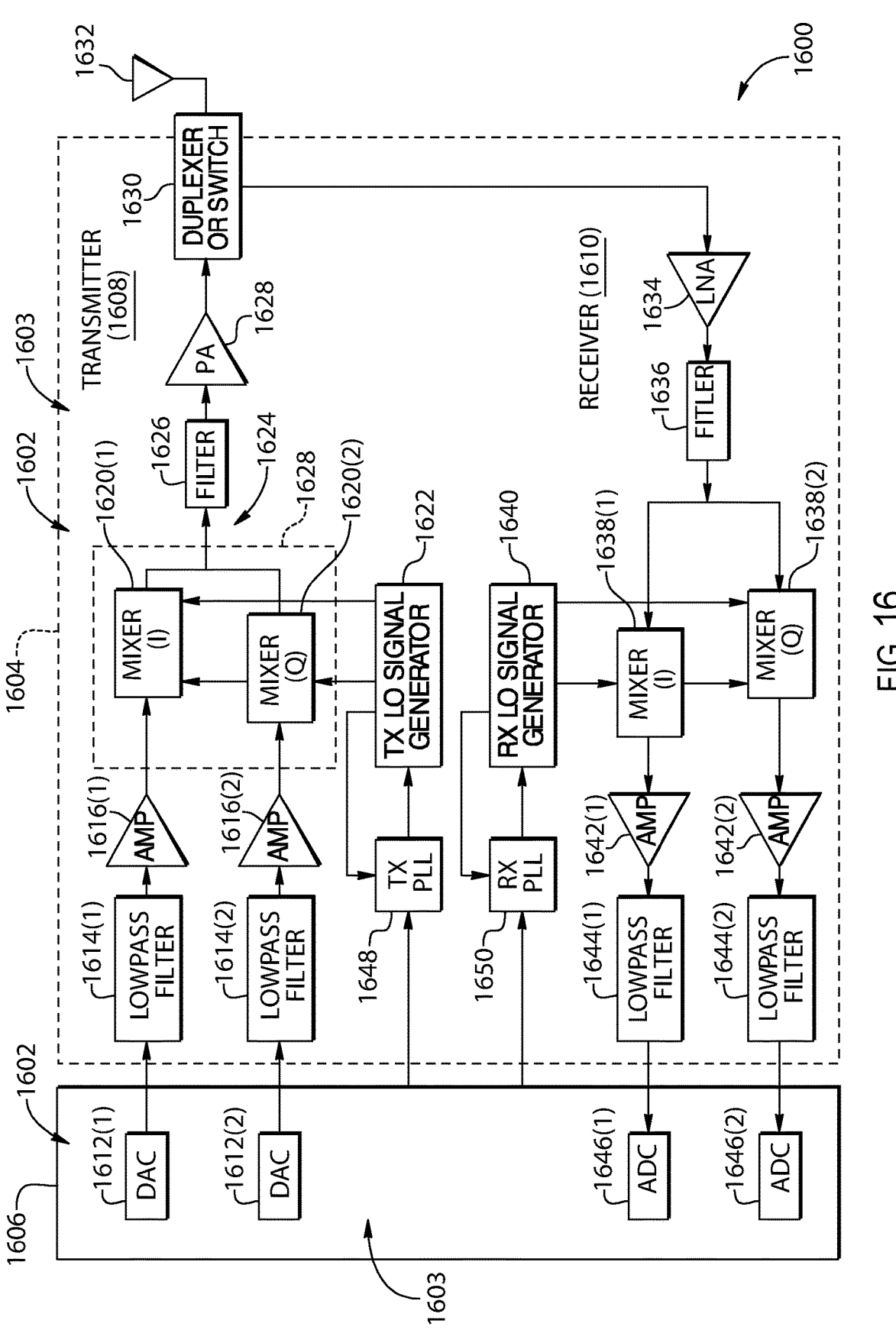
FIG. 16 is a block diagram of an exemplary wireless communications device that includes radio-frequency (RF) components that can include a die package that includes a filter that is a bare die filter that includes a die operable to be used in a filter ("filter die") coupled to a substrate with an air cavity formed in a gap between the filter die and the substrate, wherein the die package also includes a guard structure to redirect material (e.g., an encapsulation material such as a mold material and/or a coating material) from entering or seeping into the air cavity of the filter, including, but not limited to, the die packages in FIGS. 2A, 2B-1-2B-2, 2C-1-2C-2, 3, 4, 7B, 9C, 11C, 13D, and 15F and fabricated according to any of the exemplary fabrication processes in FIGS. 5-6, 8A-8B, 10A-10B, 12A-12B, and 14A-14C.

In this regard, FIG. 16 illustrates an exemplary wireless communications device 1600 that includes radio RF components formed from one or more ICs 1602, wherein any of the ICs 1602 can include a die package 1603 that includes a filter that includes a die operable to be used as a filter ("filter die") coupled to a substrate with an air cavity formed in a gap between the filter die and the substrate, wherein the die package 1603 also includes a guard structure to redirect material (e.g., an encapsulation material such as a mold material and/or a coating material) from entering or seeping into the air cavity of the filter, including, but not limited to, the die packages 200, 300, 400 in FIGS. 2A, 2B-1-2B-2, 2C-1-2C-2, 3, 4, 7B, 9C, 11C, 13D, and 15F and fabricated according to any of the exemplary fabrication processes 500, 600, 800, 1000, 1200, 1400 in FIGS. 5-6, 8A-8B, 10A-10B, 12A-12B, and 14A-14C, and according to any aspects disclosed herein. As shown in FIG. 16, the wireless communications device 1600 includes a transceiver 1604 and a data processor 1606. The data processor 1606 may include a memory to store data and program codes. The transceiver 1604 includes a transmitter 1608 and a receiver 1610 that support bi-directional communications. In general, the wireless communications device 1600 may include any number of transmitters 1608 and/or receivers 1610 for any number of communication systems and frequency bands. All or a portion of the transceiver 1604 may be implemented on one or more analog ICs, RFICs, mixed-signal ICs, etc.

The transmitter 1608 or the receiver 1610 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1610. In the direct-conversion architecture, a signal is frequency-converted between RF and baseband in one stage. The super-heterodyne and direct-conversion architectures may use different circuit blocks and/or have different requirements. In the wireless communications device 1600 in FIG. 16, the transmitter 1608 and the receiver 1610 are implemented with the direct-conversion architecture.

In the transmit path, the data processor 1606 processes data to be transmitted and provides I and Q analog output signals to the transmitter 1608. In the exemplary wireless communications device 1600, the data processor 1606 includes digital-to-analog converters (DACs) 1612(1), 1612(2) for converting digital signals generated by the data processor 1606 into the I and Q analog output signals, e.g., I and Q output currents, for further processing.

Within the transmitter 1608, lowpass filters 1614(1), 1614(2) filter the I and Q analog output signals, respectively, to remove undesired signals caused by the prior digital-to-analog conversion. Amplifiers (AMPs) 1616(1), 1616(2) amplify the signals from the lowpass filters 1614(1), 1614(2), respectively, and provide I and Q baseband signals. An upconverter 1618 upconverts the I and Q baseband signals with I and Q transmit (TX) local oscillator (LO) signals through mixers 1620(1), 1620(2) from a TX LO signal generator 1622 to provide an upconverted signal 1624. A filter 1626 filters the upconverted signal 1624 to remove undesired signals caused by the frequency upconversion as well as noise in a receive frequency band. A power amplifier (PA) 1628 amplifies the upconverted signal 1624 from the filter 1626 to obtain the desired output power level and provides a transmit RF signal. The transmit RF signal is routed through a duplexer or switch 1630 and transmitted via an antenna 1632.

In the receive path, the antenna 1632 receives signals transmitted by base stations and provides a received RF signal, which is routed through the duplexer or switch 1630 and provided to a low noise amplifier (LNA) 1634. The duplexer or switch 1630 is designed to operate with a specific receive (RX)-to-TX duplexer frequency separation, such that RX signals are isolated from TX signals. The received RF signal is amplified by the LNA 1634 and filtered by a filter 1636 to obtain a desired RF input signal. Down-conversion mixers 1638(1), 1638(2) mix the output of the filter 1636 with I and Q RX LO signals (i.e., LO_I and LO_Q) from an RX LO signal generator 1640 to generate I and Q baseband signals. The I and Q baseband signals are amplified by AMPs 1642(1), 1642(2) and further filtered by lowpass filters 1644(1), 1644(2) to obtain I and Q analog input signals, which are provided to the data processor 1606. In this example, the data processor 1606 includes analog-to-digital converters (ADCs) 1646(1), 1646(2) for converting the analog input signals into digital signals to be further processed by the data processor 1606.

In the wireless communications device 1600 of FIG. 16, the TX LO signal generator 1622 generates the I and Q TX LO signals used for frequency upconversion, while the RX LO signal generator 1640 generates the I and Q RX LO signals used for frequency downconversion. Each LO signal is a periodic signal with a particular fundamental frequency. A TX phase-locked loop (PLL) circuit 1648 receives timing information from the data processor 1606 and generates a control signal used to adjust the frequency and/or phase of the TX LO signals from the TX LO signal generator 1622. Similarly, an RX PLL circuit 1650 receives timing information from the data processor 1606 and generates a control signal used to adjust the frequency and/or phase of the RX LO signals from the RX LO signal generator 1640.

Figure 17:
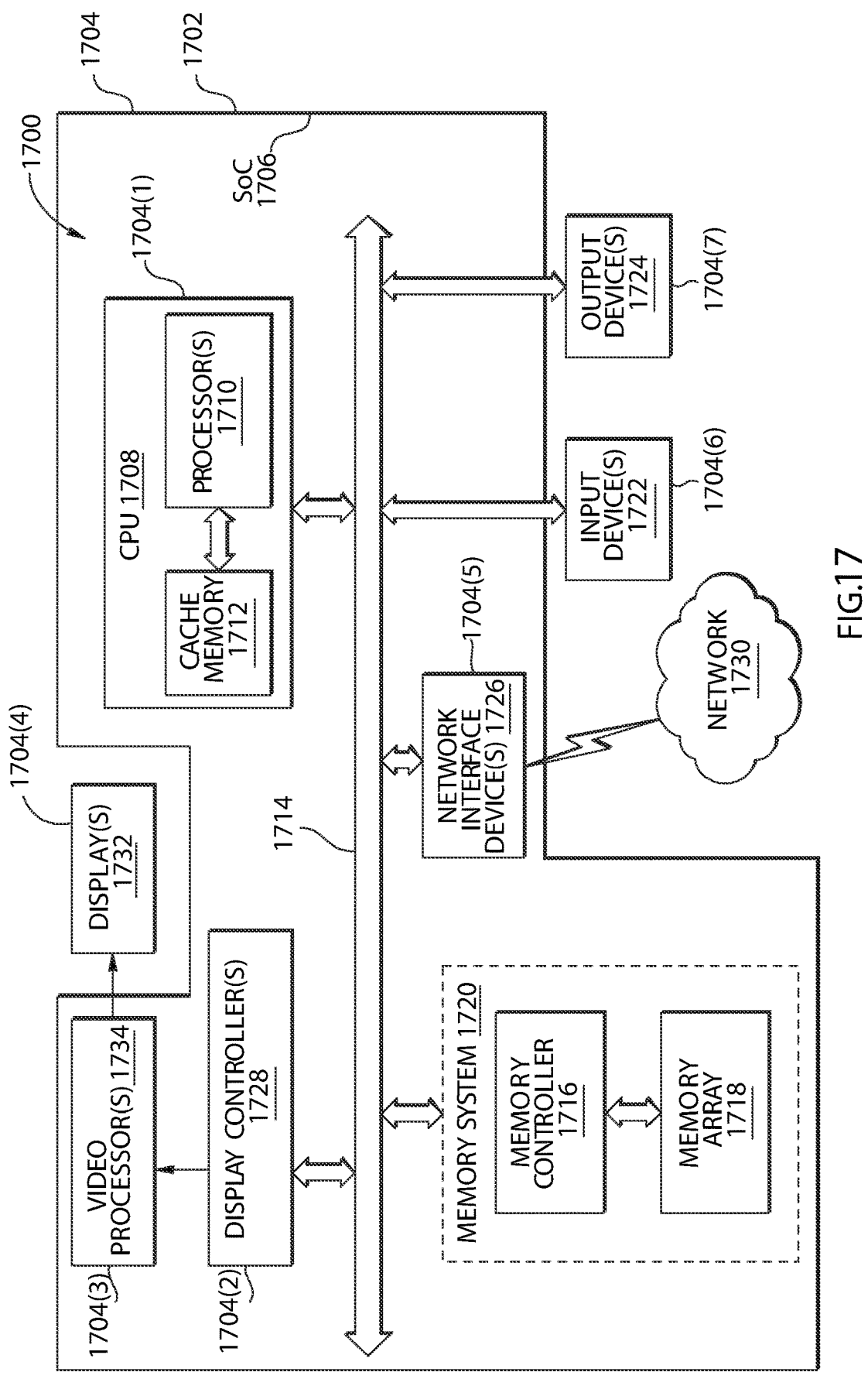
FIG. 17 is a block diagram of an exemplary processor-based system that can include a die package that includes a filter that is a bare die filter that includes a die operable to be used in a filter ("filter die") coupled to a substrate with an air cavity formed in a gap between the filter die and the substrate, wherein the die package also includes a guard structure to redirect material (e.g., an encapsulation material such as a mold material and/or a coating material) from entering or seeping into the air cavity of the filter, including, but not limited to, the die packages in FIGS. 2A, 2B-1-2B-2, 2C-1-2C-2, 3, 4, 7B, 9C, 11C, 13D, and 15F and fabricated according to any of the exemplary fabrication processes in FIGS. 5-6, 8A-8B, 10A-10B, 12A-12B, and 14A-14C.

FIG. 17 illustrates an example of a processor-based system 1700. The components of the processor-based system 1700 are ICs 1702. Some or all of the components in the processor-based system 1700 can be provided in or include a die package 1704(1)-1704(7) that includes a filter that includes a die operable to be used as a filter ("filter die") coupled to a substrate with an air cavity formed in a gap between the filter die and the substrate, wherein the packages 1704(1)-1704(7) also include a guard structure to redirect material (e.g., an encapsulation material such as a mold material and/or a coating material) from entering or seeping into the air cavity of the filter, including, but not limited to, the die packages 200, 300, 400 in FIGS. 2A, 2B-1-2B-2, 2C-1-2C-2, 3, 4, 7B, 9C, 11C, 13D, and 15F and fabricated according to any of the exemplary fabrication processes 500, 600, 800, 1000, 1200, 1400 in FIGS. 5-6, 8A-8B, 10A-10B, 12A-12B, and 14A-14C, and according to any aspects disclosed herein. In this example, the processor-based system 1700 may be formed in or included as part of a die package 1704 and as a system-on-a-chip (SoC) 1706. The processor-based system 1700 includes a CPU 1708 that includes one or more processors 1710, which may also be referred to as CPU cores or processor cores. The CPU 1708 can be included in a die package 1704(1). The CPU 1708 may have cache memory 1712 coupled to the CPU 1708 for rapid access to temporarily stored data. The CPU 1708 is coupled to a system bus 1714 and can intercouple master and slave devices included in the processor-based system 1700. As is well known, the CPU 1708 communicates with these other devices by exchanging address, control, and data information over the system bus 1714. For example, the CPU 1708 can communicate bus transaction requests to a memory controller 1716 as an example of a slave device. Although not illustrated in FIG. 17, multiple system buses 1714 could be provided, wherein each system bus 1714 constitutes a different fabric.

Other master and slave devices can be connected to the system bus 1714. As illustrated in FIG. 17, these devices can include a memory system 1720 that includes the memory controller 1716 and a memory array(s) 1718, one or more input devices 1722, one or more output devices 1724, one or more network interface devices 1726, and one or more display controllers 1728, as examples. The network interface devices 1726 can be included in or be a die package 1704(5). Each of the memory system 1720, the one or more input devices 1722, the one or more output devices 1724, the one or more network interface devices 1726, and the one or more display controllers 1728 can be provided in the same or different circuit packages. The input devices 1722 and/or the output devices 1724 can be included in respective die packages 1704(6), 1704(7). The input device(s) 1722 can include any type of input device, including, but not limited to, input keys, switches, voice processors, etc. The output device(s) 1724 can include any type of output device, including, but not limited to, audio, video, other visual indicators, etc. The network interface device(s) 1726 can be any device configured to allow exchange of data to and from a network 1730. The network 1730 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1726 can be configured to support any type of communications protocol desired.

The CPU 1708 may also be configured to access the display controller(s) 1728 over the system bus 1714 to control information sent to one or more displays 1732. The display 1732 can be included in a die package 1704(4). The display controller(s) 1728 sends information to the display(s) 1732 to be displayed via one or more video processors 1734, which process the information to be displayed into a format suitable for the display(s) 1732. The display controller(s) 1728 and video processor(s) 1734 can be included in or be a die package 1704(2), 1704(3) and the same or different circuit packages, and in the same or different circuit packages containing the CPU 1708 as an example. The display(s) 1732 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. A die package, comprising:
   a substrate comprising a first surface;
   a filter, comprising:
      a die operable to be used in a filter, comprising:
         a second surface; and
         a plurality of die edges adjacent to the second surface;
      a plurality of metal bumps coupled to the second surface and coupled to the first surface of the substrate forming a gap between the first surface and the die; and
      an air cavity in the gap between the first surface and the die; and
   one or more guard structures each adjacent to the gap and each adjacent to a first die edge of the plurality of die edges.

2. The die package of clause 1, wherein:
   the substrate comprises one or more metallization layers parallel to each other in a first direction; and
   the one or more guard structures are between the first die edge and at least one metal bump of the plurality of metal bumps in the first direction.

3. The die package of clause 2, wherein:
   the die further comprises:
      an inactive region in the gap between the plurality of metal bumps and the plurality of die edges in the first direction;
      an active filter region adjacent to the air cavity such that the plurality of metal bumps is between the active filter region and the plurality of die edges in the first direction; and
      the one or more guard structures are between the plurality of metal bumps and the plurality of die edges in the first direction.

4. The die package of clause 1, wherein:
   the substrate comprises one or more metallization layers parallel to each other in a first direction; and
   each guard structure of the one or more guard structures extends to the first die edge in the first direction and intersects a first plane of the first die edge in a second direction orthogonal to the first direction.

5. The die package of any of clauses 1-4, wherein the one or more guard structures comprise at least one guard structure extending adjacent to each die edge of the plurality of die edges.

6. The die package of any of clauses 1-5, wherein the one or more guard structures are comprised of a material comprised from the group consisting of a metal material, a dielectric material, a photoresist film, and a passivation layer.

7. The die package of any of clauses 1-3, 5, and 6, wherein the one or more guard structures comprise one or more channels in the gap and adjacent to the first die edge.

8. The die package of any of clauses 1-3, 5, and 6, wherein the one or more guard structures comprise a plurality of channels parallel to each other.

9. The die package of clause 7, wherein the one or more channels are disposed between a plurality of channel structures parallel to each other and extending beyond the first surface of the substrate in the gap.

10. The die package of clause 7 or 9, wherein:
   the substrate comprises one or more metallization layers parallel to each other in a first direction; and
   the one or more channels are between the first die edge and at least one metal bump of the plurality of metal bumps in the first direction.

11. The die package of any of clauses 7, 9, and 10, wherein the one or more channels extend continuously in a closed pattern adjacent to each die edge of the plurality of die edges.

12. The die package of any of clauses 7, 9, and 10, wherein the one or more channels are non-continuous.

13. The die package of any of clauses 1-6, wherein the one or more guard structures comprise a raised structure coupled to the second surface, the raised structure in the gap and adjacent to the first die edge.

14. The die package of clause 13, wherein:
   the substrate comprises one or more metallization layers parallel to each other in a first direction; and
   the raised structure is between the first die edge and at least one metal bump of the plurality of metal bumps in the first direction.

15. The die package of any of clauses 1-6, wherein the one or more guard structures comprise one or more die recesses in the die, wherein the one or more die recesses are adjacent to the first die edge.

16. The die package of clause 15, wherein:
   the substrate comprises one or more metallization layers parallel to each other in a first direction; and
   the one or more die recesses extend to the first die edge in the first direction and intersect a first plane of the first die edge in a second direction orthogonal to the first direction.

17. The die package of clause 15 or 16, wherein the one or more die recesses extend continuously in a closed pattern adjacent to each die edge of the plurality of die edges.

18. The die package of any of clauses 1-17 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

19. A method of fabricating a die package, comprising:
   providing a substrate comprising a first surface;
   providing a die operable to be used in a filter and comprising a second surface, a plurality of die edges adjacent to the second surface, and a plurality of metal bumps coupled to the second surface;
   forming one or more guard structures on the die and adjacent to a first die edge of the plurality of die edges; and
   coupling the plurality of metal bumps to the first surface of the substrate forming an air cavity in a gap between the first surface and the die and disposing the one or more guard structures adjacent to the gap.

20. The method of clause 19, wherein:
   providing the substrate further comprises providing the substrate comprising one or more metallization layers parallel to each other in a first direction; and
   disposing the one or more guard structures adjacent to the gap comprises disposing the one or more guard structures between the first die edge and at least one metal bump of the plurality of metal bumps in the first direction.

21. The method of clause 19, wherein:

providing the substrate further comprises providing the substrate comprising one or more metallization layers parallel to each other in a first direction; and disposing the one or more guard structures adjacent to the gap comprises disposing the one or more guard structures to extend to the first die edge in the first direction and intersect a first plane of the first die edge in a second direction orthogonal to the first direction.

22. The method of any of clauses 19-21, wherein forming the one or more guard structures further comprises forming at least one guard structure of the one or more guard structures extending adjacent to each die edge of the plurality of die edges.

23. The method of clause 19 or 22, wherein forming the one or more guard structures comprises forming one or more channels on the die and adjacent to the first die edge.

24. The method of clause 23, wherein forming the one or more channels on the die and adjacent to the first die edge, comprises:

disposing a first layer on the second surface of the die; and patterning the first layer to form one or more openings comprising the one or more channels in the first layer on the die and adjacent to the first die edge.

25. The method of any of clauses 19-22, wherein forming the one or more guard structures comprises forming a raised structure coupled to the second surface of the die and adjacent to the first die edge.

26. The method of clause 25, wherein forming the raised structure coupled to the second surface of the die and adjacent to the first die edge comprises:

disposing a first layer on the second surface of the die; and patterning the first layer to form the raised structure coupled to the second surface of the die and adjacent to the first die edge.

27. The method of clause 19, wherein forming the one or more guard structures comprises forming one or more die recesses in the die adjacent to the first die edge.

28. The method of clause 27, wherein:

providing the substrate further comprises providing the substrate comprising one or more metallization layers parallel to each other in a first direction; and forming the one or more die recesses further comprises forming the one or more die recesses extending to the first die edge and intersecting a first plane of the first die edge in a second direction orthogonal to the first direction.

29. The method of clause 27 or 28, wherein forming the one or more die recesses in the die adjacent to the first die edge comprises cutting the second surface and adjacent to the first die edge to form the one or more die recesses in the die.

What is claimed is:

1. A die package, comprising:

a substrate comprising a first surface;

a filter, comprising:

a die operable to be used in the filter, comprising:

a second surface; and a plurality of die edges adjacent to the second surface;

a plurality of metal bumps coupled to the second surface and coupled to the first surface of the substrate forming a gap between the first surface and the die; and an air cavity in the gap between the first surface and the die; and one or more guard structures each adjacent to the gap and each adjacent to a first die edge of the plurality of die edges;

wherein the one or more guard structures comprise one or more channels in the gap and adjacent to the first die edge;

wherein the one or more channels are disposed between a plurality of channel structures parallel to each other and extending beyond the first surface of the substrate in the gap.

2. The die package of claim 1, wherein:

the substrate comprises one or more metallization layers parallel to each other in a first direction; and the one or more guard structures are between the first die edge and at least one metal bump of the plurality of metal bumps in the first direction.

3. The die package of claim 2, wherein:

the die further comprises:

an inactive region in the gap between the plurality of metal bumps and the plurality of die edges in the first direction;

an active filter region adjacent to the air cavity such that the plurality of metal bumps is between the active filter region and the plurality of die edges in the first direction; and the one or more guard structures are between the plurality of metal bumps and the plurality of die edges in the first direction.

4. The die package of claim 1, wherein:

the substrate comprises one or more metallization layers parallel to each other in a first direction; and each guard structure of the one or more guard structures extends to the first die edge in the first direction and intersects a first plane of the first die edge in a second direction orthogonal to the first direction.

5. The die package of claim 1, wherein the one or more guard structures comprise at least one guard structure extending adjacent to each die edge of the plurality of die edges.

6. The die package of claim 1, wherein the one or more guard structures are comprised of a material comprised from the group consisting of a metal material, a dielectric material, a photoresist film, and a passivation layer.

7. The die package of claim 1, wherein the one or more guard structures comprise a plurality of channels parallel to each other.

8. The die package of claim 1, wherein:

the substrate comprises one or more metallization layers parallel to each other in a first direction; and the one or more channels are between the first die edge and at least one metal bump of the plurality of metal bumps in the first direction.

9. The die package of claim 1, wherein the one or more channels extend continuously in a closed pattern adjacent to each die edge of the plurality of die edges.

10. The die package of claim 1, wherein the one or more channels are non-continuous.

11. The die package of claim 1 integrated into a device selected from the group consisting of: a set top box; an entertainment unit; a navigation device; a communications device; a fixed location data unit; a mobile location data unit;

a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

12. A die package, comprising:
a substrate comprising a first surface;
a filter, comprising:
  a die operable to be used in the filter, comprising:
    a second surface; and
    a plurality of die edges adjacent to the second surface;
  a plurality of metal bumps coupled to the second surface and coupled to the first surface of the substrate forming a gap between the first surface and the die; and an air cavity in the gap between the first surface and the die; and
one or more guard structures each adjacent to the gap and each adjacent to a first die edge of the plurality of die edges;
wherein the one or more guard structures comprise one or more die recesses in the die, wherein the one or more die recesses are adjacent to the first die edge.

13. The die package of claim 12, wherein:
the substrate comprises one or more metallization layers parallel to each other in a first direction; and
the one or more die recesses extend to the first die edge in the first direction and intersect a first plane of the first die edge in a second direction orthogonal to the first direction.

14. The die package of claim 12, wherein the one or more die recesses extend continuously in a closed pattern adjacent to each die edge of the plurality of die edges.

* * * * *